(12) United States Patent
Umimoto et al.

(10) Patent No.: US 6,921,933 B2
(45) Date of Patent: Jul. 26, 2005

(54) SEMICONDUCTOR DEVICE AND METHOD OF FABRICATING THE SAME

(75) Inventors: Hiroyuki Umimoto, Hyogo (JP); Shinji Odanaka, Osaka (JP)

(73) Assignee: Matsushita Electric Industrial Co., Ltd.

(*) Notice: Subject to any disclaimer, the term of this patent is extended or adjusted under 35 U.S.C. 154(b) by 0 days.

(21) Appl. No.: 10/713,221

(22) Filed: Nov. 17, 2003

(65) Prior Publication Data

US 2004/0099890 A1 May 27, 2004

Related U.S. Application Data

(62) Division of application No. 09/996,932, filed on Nov. 30, 2001, now Pat. No. 6,667,216, which is a division of application No. 09/570,391, filed on May 12, 2000, now Pat. No. 6,333,217.

(30) Foreign Application Priority Data

May 14, 1999 (JP) .......................................... 11-133846

(51) Int. Cl.[7] .............................................. H01L 29/76
(52) U.S. Cl. ........................................ 257/288; 257/336
(58) Field of Search ................................ 257/288, 335, 257/336

(56) References Cited

U.S. PATENT DOCUMENTS

| | | |
|---|---|---|
| 5,244,823 A | 9/1993 | Adan |
| 5,320,974 A | 6/1994 | Hori et al. |
| 5,401,994 A | 3/1995 | Adan |
| 5,895,954 A | 4/1999 | Yasumura et al. |
| 6,081,007 A | 6/2000 | Matsuoka |
| 6,180,443 B1 | 1/2001 | Kang et al. |
| 6,228,725 B1 * | 5/2001 | Nandakumar et al. ...... 438/289 |
| 6,251,718 B1 | 6/2001 | Akamatsu et al. |
| 6,306,712 B1 | 10/2001 | Rodder et al. |
| 6,312,981 B1 | 11/2001 | Akamatsu et al. |
| 6,479,356 B1 | 11/2002 | Matsuoka |
| 6,482,660 B2 * | 11/2002 | Conchieri et al. ............. 438/7 |
| 6,579,770 B2 | 6/2003 | Rodder et al. |
| 6,583,017 B2 * | 6/2003 | Hu et al. .................... 438/306 |
| 6,686,629 B1 * | 2/2004 | Assaderaghi et al. ....... 257/347 |

FOREIGN PATENT DOCUMENTS

| | | |
|---|---|---|
| JP | 04158529 A | 6/1992 |
| JP | 04343437 A | 11/1992 |
| JP | 07022619 A | 1/1995 |
| JP | 08306923 A | 11/1996 |
| JP | 10065149 A | 3/1998 |
| JP | 10270687 A | 10/1998 |
| JP | 10294454 A | 11/1998 |
| JP | 11261069 | 9/1999 |
| JP | 2000049344 A | 2/2000 |
| JP | 2000299447 A | 10/2000 |
| WO | WO 97/50115 | 12/1997 |

OTHER PUBLICATIONS

Shahidi et al. (Oct. 1993) IEEE Electronics Device Letters, *High–Performance Devices for a 0.15 μm CMOS Technology*, vol. 14 No. 10 (pp. 466–468).

Bouillon et al. (1997) IEEE, *Anomalous short channel effects in Indium implemented nMOSFETs*, 4 pages.

* cited by examiner

*Primary Examiner*—David S. Blum
(74) *Attorney, Agent, or Firm*—Nixon Peabody LLP; Donald R. Studebaker

(57) ABSTRACT

A gate electrode is formed on a semiconductor substrate with agate insulating film interposed therebetween. A channel region composed of a first-conductivity-type semiconductor layer is formed in a region of a surface portion of the semiconductor substrate located below the gate electrode. Source/drain regions each composed of a second-conductivity-type impurity layer are formed in regions of the surface portion of the semiconductor substrate located on both sides of the gate electrode. Second-conductivity-type extension regions are formed between the channel region and respective upper portion of the source/drain regions in contact relation with the source/drain regions. First-conductivity-type pocket regions are formed between the channel region and respective lower portion of the source/drain regions in contact relation with the source/drain regions and in spaced relation to the gate insulating film.

9 Claims, 19 Drawing Sheets

SEMICONDUCTOR DEVICE AND METHOD OF FABRICATING THE SAME

Divisional of prior Application No: 09/996,932 filed Nov. 30, 2001 now U.S. Pat. No. 6,667,216; which is a Divisional of application Ser. No. 09/570,391 filed May 12, 2000, now U.S. Pat. No. 6,333,217.

BACKGROUND OF THE INVENTION

The present invention relates to a semiconductor device having a MOS transistor which is excellent in driving force and a method of fabricating the same.

The recent development of a highly integrated semiconductor device or so-called VLSI has required increasing miniaturization of MOS transistors as constituents of the VLSI. In the MOS transistors, an attempt has been made to reduce the dimensions of devices in different generations in accordance with scaling rules. In response to the reduced dimensions, substrate concentration has been increased to suppress a so-called short-channel effect and thereby improve the properties of the devices.

Among various dimensions of the device, however, the depth of an impurity layer as a source or drain is difficult to reduce. Under such circumstances, a structure for suppressing the short-channel effect has been proposed for a MOS transistor.

As a conventional embodiment, the structure of a MOS transistor shown in, e.g., "High-Performance Devices for a 0.15 μm CMOS technology (G. G. Shahidi et al, IEEE Electron Device Letters, vol. 14, no. 10, October 1993)" (hereinafter simply referred to as the conventional MOS transistor) and a fabrication method therefore will be described with reference to FIG. 20.

As shown in FIG. 20, the conventional MOS transistor comprises: a $p^-$-type well region 2 formed in a semiconductor substrate 1; a p-type channel region 3 formed in a surface portion of the semiconductor substrate 1; a gate electrode 5 formed on the channel region 3 with a gate insulating film 4 interposed therebetween, source/drain regions 9 composed of $n^+$-type impurity layers formed in the respective regions of the surface portion of the semiconductor substrate 1 which are located on both sides of the gate electrode 5, extension regions 6 composed of $n^+$-type impurity layers formed inwardly of the source/drain regions 9 in the surface portion of the semiconductor substrate 1, and $p^+$-type pocket regions 7 formed in the surface portion of the semiconductor substrate 1 to cover the extension regions 6 and have an upper end portion extending to the gate insulating film 4.

The conventional MOS transistor comprises the $p^+$-type pocket regions 7 formed to cover the $n^+$-type extension regions 6. Since the pocket regions 7 inhibit depletion layers from extending from the $n^+$-type extension regions 6 and the source/drain regions 9, the short-channel effect can be suppressed.

Even if the depth of the extension region 6 or of the source/drain regions 9 cannot be reduced in accordance with the scaling rules, the short-channel effect can be suppressed by increasing impurity concentration in the pocket regions 7.

However, the conventional MOS transistor has the following problems.

First Problem

If impurity concentration in the $p^+$-type pocket regions is increased to further suppress the short-channel effect, impurity concentration in the extension regions is reduced as a result of cancellation, since the $n^+$-type extension regions are covered with the pocket regions. This causes the problem that the resistance of the extension regions is increased and the driving force of the MOS transistor is thereby decreased. If impurity concentration in the $p^+$-type pocket regions is increased, impurity concentration in the portions of the channel region adjacent the extension regions is also increased so that impurity scattering in a carrier flow is aggravated and the mobility of carriers is lowered. This further decreases the driving force of the MOS transistor. If impurity concentration in the portions of the channel region adjacent the extension regions is increased, a so-called reverse short-channel effect occurs to cause the problem that the threshold voltage of the transistor is largely dependent on the channel length of the transistor.

Second Problem

Sidewalls are formed by depositing, after the extension regions are formed by implanting n-type impurity ions and the pocket regions are formed by implanting p-type impurity ions, an insulating film over the entire surface of the semiconductor substrate at a low temperature of 600° C. to 850° C. for a period of several tens of minutes to several hours, and then performing anisotropic etching with respect to the insulating film. However, transient enhanced diffusion of the impurity is caused remarkably by point defects (voids and interstitial silicons) produced during the implantation of the impurity ions. This increases impurity concentration in the pocket regions so that the resistance of the extension regions increases and the mobility of carriers lowers. This decreases the driving force of the MOS transistor. Moreover, the interstitial silicons produced during the ion implantation for forming the extension regions and the pocket regions are diffused toward the gate insulating film during the low-concentration heat treatment (e.g., during the deposition of the insulating film as the sidewalls), so that a gradient is produced in the distribution. As a consequence, the impurity in the end portion of the channel region adjacent the gate electrode moves toward the substrate surface, which increases impurity concentration in the surface region of the end portion of the channel region adjacent the gate electrode. This causes the so-called reverse short-channel effect and varies the threshold voltage disadvantageously. The phenomenon is conspicuous when the pocket regions are formed by implanting boron ions.

Third Problem

In the method of fabricating the conventional MOS transistor, the $p^+$-type pocket regions are a morphized by implanting indium ions therein such that the distribution of arsenic ions in the $n^+$-type extension regions is sharpened.

However, the present inventors have newly found that a heat treatment performed after the a morphizing step causes point defects in the inner portions of the pocket regions adjacent the pn junction formed between the extension regions and the pocket regions (i.e., outside the extension regions). The point defects produced in the pocket regions cause a junction leakage current. If a VLSI having such a MOS transistor is incorporated into mobile communication equipment, there occurs the problem that the junction leakage current increases power consumption during standby.

SUMMARY OF THE INVENTION

In view of the foregoing, it is therefore an object of the present invention to increase the driving force of a MOS transistor.

To attain the object, a first semiconductor device according to the present invention comprises: a gate electrode formed on a semiconductor substrate with a gate insulating film interposed therebetween; a channel region composed of a first-conductivity-type semiconductor layer formed in a region of a surface portion of the semiconductor substrate located below the gate electrode; source/drain regions composed of second-conductivity-type impurity layers formed in regions of the surface portion of the semiconductor substrate located on both sides of the gate electrode; second-conductivity-type extension regions formed between the channel region and respective upper portions of the source/drain regions in contact relation with the source/drain regions; and first-conductivity-type pocket regions formed between the channel region and respective lower portions of the source/drain regions in contact relation with the source/drain regions and in spaced relation to the gate insulating film.

Since the first semiconductor device comprises the first-conductivity-type pocket regions between the channel region and the respective lower portions of the source/drain regions in contact relation with the source/drain regions and in spaced relation to the gate insulating film, impurity concentration in the extension regions does not decrease and impurity concentration in the portions of the channel region adjacent the extension regions does not increase even if impurity concentration in the pocket regions is increased to suppress the short-channel effect.

Since impurity concentration in the extension regions does not decrease, the resistance of the extension regions does not increase so that a decrease in the driving force of the MOS transistor is suppressed. Moreover, since impurity concentration in the portions of the channel region adjacent the extension regions does not increase, the lowering of the mobility of carriers due to impurity scattering in a carrier flow is prevented so that a decrease in the driving force of the MOS transistor is prevented.

Accordingly, the first semiconductor device prevents a decrease in the driving force of the MOS transistor, while suppressing the short-channel effect.

Preferably, the first semiconductor device further comprises: first-conductivity-type lightly doped channel regions formed in both side portions of the channel region in contact relation with the extension regions, each of the lightly doped channel regions containing an activated impurity at a concentration lower than in a center portion of the channel region.

In the arrangement, the lightly doped channel regions containing the activated impurity at a concentration lower than in the center portion of the channel region are provided on both side portions of the channel region in contact relation to the extension regions. As a consequence, the concentration of the activated impurity in the upper portions of the channel region is lower in both side portions thereof adjacent the source/drain regions and higher in the middle portion thereof. In other words, the concentration of the activated impurity in the portions of the channel region in contact with the extension regions is lower.

Accordingly, the resistance of the extension regions is further lowered so that a decrease in the driving force of the MOS transistor is prevented more positively.

A second semiconductor device according to the present invention comprises: a gate electrode formed on a semiconductor substrate with a gate insulating film interposed therebetween; a channel region composed of a first-conductivity-type semiconductor layer doped with indium ions and formed in a region of a surface portion of the semiconductor substrate located below the gate electrode; source/drain regions composed of second-conductivity-type impurity layers formed in regions of the surface portion of the semiconductor substrate located on both sides of the gate electrode; second-conductivity-type extension regions formed between the channel region and respective upper portions of the source/drain regions in contact relation with the source/drain regions; and first-conductivity-type lightly doped channel regions formed in both side portions of the channel region in contact relation with the extension regions, each of the lightly doped channel regions containing an activated impurity at a concentration lower than in a center portion of the channel region.

In the second semiconductor device, the lightly-doped channel regions containing the activated impurity at a concentration lower than in the center portion of the channel region are provided in both side portions of the channel region in contact relation with the extension regions. As a consequence, the concentration of the activated impurity in the upper portions of the channel region is lower in both side portions thereof adjacent the source/drain regions and higher in the middle portion thereof. In other words, the concentration of the activated impurity in the portions of the channel region in contact with the extension regions is lower. This lowers the resistance of the extension regions and prevents a decrease in the driving force of the MOS transistor.

A first method of fabricating a semiconductor device according to the present invention comprises the steps of: ion implanting a first-conductivity-type impurity into a surface portion of a semiconductor substrate to form a first-conductivity-type semiconductor layer as a channel region; forming a gate electrode on the semiconductor substrate with a gate insulating film interposed therebetween; ion implanting a second-conductivity-type impurity into the semiconductor layer by using the gate electrode as a mask to form first second-conductivity-type impurity layers in upper portions of the semiconductor layer; implanting indium ions into the semiconductor layer by using the gate electrode as a mask to form first-conductivity-type impurity layers in lower portions of the semiconductor layer; performing a short-time heat treatment with respect to the semiconductor substrate at a temperature of about 950° C. to 1050° C.; forming sidewalls on side surfaces of the gate electrode; and ion implanting a second-conductivity-type impurity into the first second-conductivity-type impurity layers and into the first-conductivity-type impurity layers by using the gate electrode and the sidewalls as a mask to form source/drain regions each composed of a second-conductivity-type impurity layer in respective regions of the first second-conductivity-type impurity layers and the first-conductivity-type impurity layers located on both sides of the gate electrode, form second-conductivity-type extension regions inwardly of respective upper portions of the source/drain regions in the respective first second-conductivity-type impurity layers, and form first-conductivity-type pocket regions inwardly of respective lower portions of the source/drain regions in the respective first-conductivity-type impurity layers.

In accordance with the first method of fabricating the semiconductor device, the first-conductivity-type impurity layers as the pocket regions are formed by implanting indium ions having an atomic mass larger than that of boron ions. As a consequence, the distribution of impurity concentration in the pocket regions has a peak in a shallow position and the extent to which the pocket regions expand is limited. Since the diffusion coefficient of indium ions is lower than that of boron ions, the expansion of the pocket regions due to thermal diffusion is suppressed.

Like boron ions, indium ions have the possibility of undergoing transient enhanced diffusion caused by point defects produced during ion implantation. However, the first method of fabricating the semiconductor device allows suppression of transient enhanced diffusion caused by the point defects since it forms the first-conductivity-type impurity layers as the pocket regions by implanting indium ions and then performs the short-time heat treatment at a temperature of about 950° C. to 1050° C.

Therefore, the first method of fabricating the semiconductor device ensures the fabrication of the first semiconductor device having the pocket regions disposed in spaced relation to the gate insulating film.

In the first method of fabricating a semiconductor device, a dose of the indium ions in the step of forming the first-conductivity-type impurity layers is preferably $5 \times 10^{13}$ cm$^{-2}$ or less.

In the arrangement, the silicon crystal is not a morphized in the first-conductivity-type impurity layers as the pocket regions and EOR point defects such as dislocation loops are not produced, so that the occurrence of a junction leakage current is prevented.

A second method of fabricating a semiconductor device according to the present invention comprises the steps of: ion implanting a first-conductivity-type impurity into a surface portion of a semiconductor substrate to form a first-conductivity-type semiconductor layer as a channel region; forming a gate electrode on the semiconductor substrate with a gate insulating film interposed therebetween; ion implanting an atom belonging to the Group IV into the semiconductor layer by using the gate electrode as a mask to form first-conductivity-type amorphous layers in upper portions of the semiconductor layer; ion implanting a second-conductivity-type impurity into the amorphous layers by using the gate electrode as a mask to form first second-conductivity-type impurity layers in the respective amorphous layers; implanting indium ions into the semiconductor layer by using the gate electrode as a mask to form first-conductivity-type impurity layers in lower portions of the semiconductor layer; performing a short-time heat treatment at a temperature of about 950° C. to 1050° C. with respect to the semiconductor substrate; forming sidewalls on side surfaces of the gate electrode; ion implanting a second-conductivity-type impurity into the first second-conductivity-type impurity layers and into the first-conductivity-type impurity layers by using the gate electrode and the sidewalls as a mask to form source/drain regions each composed of a second second-conductivity-type impurity layer in respective regions of the first second-conductivity-type impurity layers and the first-conductivity-type impurity layers located on both sides of the gate electrode, form second-conductivity-type extension regions inwardly of respective upper portions of the source/drain regions in the respective first second-conductivity-type impurity layers, and form first-conductivity-type pocket regions inwardly of respective lower portions of the source/drain regions in the respective first-conductivity-type impurity layers.

In accordance with the second method of fabricating the semiconductor device, the first-conductivity-type impurity layers as the pocket regions are formed by implanting indium ions having an atomic mass larger than that of boron ions and a diffusion coefficient lower than that of boron ions, similarly to the first method of fabricating the semiconductor device. As a consequence, the distribution of impurity concentration in the pocket regions has a peak in a shallow position and the extent to which the pocket regions expand is limited. In addition, the expansion of the pocket regions by thermal diffusion is suppressed. Therefore, the second method of fabricating the semiconductor device ensures the fabrication of the first semiconductor device having the pocket regions disposed in spaced relation to the gate insulating film.

Since the second method of fabricating the semiconductor device has formed the amorphous layers in the upper portions of the first-conductivity-type semiconductor layer and then formed the first second-conductivity-type impurity layers as the extension regions by ion implanting the second-conductivity-type impurity, the distribution of impurity concentration in the first second-conductivity-type impurity layers becomes particularly sharp. This lowers the resistance of the extension regions and thereby increase the driving force of the MOS transistor.

In the second method of fabricating a semiconductor device, a dose of the indium ions in the step of forming the first-conductivity-type impurity layers is preferably $5 \times 10^{-}$ cm$^{-2}$ or less.

In the arrangement, the silicon crystal is not amorphized in the first-conductivity-type impurity layers as the pocket regions and the EOR point defects such as the dislocation loops are not produced, so that the occurrence of the junction leakage current is prevented.

A third method of fabricating a semiconductor device according to the present invention comprises the steps of: implanting indium ions into a surface portion of a semiconductor substrate to form a first-conductivity-type semiconductor layer as a channel region; forming a gate electrode on the semiconductor substrate with a gate insulating film interposed therebetween; ion implanting a second-conductivity-type impurity into the semiconductor layer by using the gate electrode as a mask to form first second-conductivity-type impurity layers in upper portions of the semiconductor layer; depositing an insulating film over the entire surface of the semiconductor substrate at a temperature of about 600° C. to 850° C. to form first-conductivity-type lightly doped channel regions inwardly of the respective first second-conductivity-type impurity layers and in upper portions of the semiconductor layer, each of the lightly doped channel regions containing the impurity at a concentration lower than in the semiconductor layer; performing anisotropic etching with respect to the insulating film to form sidewalls on side surfaces of the gate electrode; and ion implanting a second-conductivity-type impurity into the first second-conductivity-type impurity layers and into the semiconductor layer by using the gate electrode and the sidewalls as a mask to form source/drain regions each composed of a second second-conductivity-type impurity layer in respective regions of the first second-conductivity-type impurity layers and the semiconductor layer located on both sides of the gate electrode and form second-conductivity-type extension regions inwardly of respective upper portions of the source/drain regions in the respective first second-conductivity-type impurity layers.

The third method of fabricating the semiconductor device comprises the steps of: implanting indium ions to form the first-conductivity-type semiconductor layer as the channel region; and ion implanting the second-conductivity-type impurity to form the first second-conductivity-type impurity layers as the extension regions and performing the low-temperature long-time heat treatment at a temperature of about 600° C. to 850° C. in depositing the insulating film. Although interstitial silicon atoms generated during the formation of the first second-conductivity-type impurity layers as the extension regions by ion implantation are caused to move toward the gate insulating film by the low-temperature long-time heat treatment, they are bonded to indium ions present in the portions of the first-conductivity-type semiconductor layer underlying both side portions of the gate insulating film to inactivate the indium ions. As a consequence, the lightly doped channel regions each containing the activated impurity at a concentration lower than in the first-conductivity-type semiconductor layer are formed in the portions of the first-conductivity-type semiconductor layer as the channel region which underlie the both side portions of the gate insulating film, i.e., inwardly of the respective first second-conductivity-type impurity layers in the first-conductivity-type semiconductor layer.

Therefore, the third method of fabricating the semiconductor device ensures the fabrication of the second semiconductor device having the lightly doped channel regions each containing the activated impurity at a concentration lower than in the center portion of the channel region in the both side portions of the channel region.

A fourth method of fabricating a semiconductor device according to the present invention comprises the steps of: forming a first-conductivity-type semiconductor layer as a channel region by implanting indium ions into a surface portion of a semiconductor substrate; forming a gate electrode on the semiconductor substrate with a gate insulating film interposed therebetween; ion implanting an atom belonging to the Group IV by using the gate electrode as a mask to form first-conductivity-type amorphous layers in upper portions of the semiconductor layer; ion implanting a second-conductivity-type impurity into the amorphous layers by using the gate electrode as a mask to form first second-conductivity-type impurity layers; depositing an insulating film over the entire surface of the semiconductor substrate at a temperature of about 600° C. to 850° C. to form first-conductivity-type lightly doped channel regions inwardly of the respective first second-conductivity-type impurity layers and in upper portions of the semiconductor layer, each of the lightly doped channel regions containing the impurity at a concentration lower than in the semiconductor layer; performing anisotropic etching with respect to the insulating film to form sidewalls on side surfaces of the gate electrode; and ion implanting a second-conductivity-type impurity into the first second-conductivity-type impurity layers and into the semiconductor layer by using the gate electrode and the sidewalls as a mask to form source/drain regions each composed of a second second-conductivity-type impurity layer in respective regions of the first second-conductivity-type impurity layers and the semiconductor layer located on both sides of the gate electrode and form second-conductivity-type extension regions inwardly of respective upper portions of the source/drain regions in the respective first second-conductivity-type impurity layers.

The fourth method of fabricating the semiconductor device comprises the steps of: implanting indium ions to form the first-conductivity-type semiconductor layer as the channel region; and ion implanting the second-conductivity-type impurity to form the first second-conductivity-type impurity layers as the extension regions and performing the low-temperature long-time heat treatment at a temperature of about 600° C. to 850° C. in depositing the insulating film, similarly to the third method of fabricating the semiconductor device. In moving toward the gate insulating film, the interstitial silicon atoms are bonded to indium ions present in the portions of the first-conductivity-type semiconductor layer underlying both side portions of the gate insulating film to inactivate the indium ions. As a consequence, the lightly doped channel regions each containing the activated impurity at a concentration lower than in the first-conductivity-type semiconductor layer are formed inwardly of the first second-conductivity-type impurity layers in the first-conductivity-type semiconductor layer.

Since the fourth method of fabricating the semiconductor device comprises the step of forming the amorphous layers in the upper portions of the first-conductivity-type semiconductor layer by ion implanting an atom belonging to the Group IV prior to the step of ion implanting the second-conductivity-type impurity to form the first second-conductivity-type impurity layers as the extension regions, the number of interstitial silicon atoms generated in the upper portions of the first-conductivity-type semiconductor layer is increased, so that the number of indium ions bonded to the interstitial silicon atoms and thereby inactivated is increased. This allows efficient formation of the lightly doped channel regions each containing the activated impurity at a concentration lower than in the first-conductivity-type semiconductor layer.

A fifth method of fabricating a semiconductor device according to the present invention comprises the steps of: implanting indium ions into a surface portion of a semiconductor substrate to form a first-conductivity-type semiconductor layer as a channel region; forming a gate electrode on the semiconductor substrate with a gate insulating film interposed therebetween; ion implanting a second-conductivity-type impurity into the semiconductor layer by using the gate electrode as a mask to form first second-conductivity-type impurity layers in upper portions of the semiconductor layer; performing a long-time first heat treatment with respect to the semiconductor substrate at a temperature of about 600° C. to 850° C. to form first-conductivity-type lightly doped channel regions inwardly of the respective first second-conductivity-type impurity layers and in upper portions of the semiconductor layer, each of the lightly doped channel regions containing the impurity at a concentration lower than in the semiconductor layer; implanting indium ions into the semiconductor layer by using the gate electrode as a mask to form first-conductivity-type impurity layers in lower portions of the semiconductor layer; performing a short-time second heat treatment at a temperature of about 950° C. to 1050° C. with respect to the semiconductor substrate; forming sidewalls on side surfaces of the gate electrode; and ion implanting a second-conductivity-type impurity into the first second-conductivity-type impurity layers and into the first-conductivity-type impurity layers by using the gate electrode and the sidewalls as a mask to form source/drain regions each composed of a second second-conductivity-type impurity layer in respective regions of the first second-conductivity-type impurity layers and the first-conductivity-type impurity layers located on both sides of the gate electrode, form second-conductivity-type extension regions inwardly of respective upper portions of the source/drain regions in the respective first second-conductivity-type impurity layers, and form first-conductivity-type pocket regions inwardly of respective lower portions of the source/drain regions in the respective first-conductivity-type impurity layers.

The fifth method of fabricating the semiconductor device comprises the steps of: implanting indium ions to form the first-conductivity-type semiconductor layer as the channel region; and ion implanting the second-conductivity-type impurity to form the first second-conductivity-type impurity layers as the extension regions and then performing the low-temperature long-time heat treatment at a temperature of about 600° C. to 850° C. In moving toward the gate insulating film, the interstitial silicon atoms are bonded to indium ions present in the lower portions of the first-conductivity-type semiconductor layer located on both sides of the gate insulating film to inactivate the indium ions, similarly to the third method of fabricating the semiconductor device. As a consequence, the lightly doped channel regions each containing the activated impurity at a concentration lower than in the first-conductivity-type semiconductor layer are formed inwardly of the respective first second-conductivity-type impurity layers in the first-conductivity-type semiconductor layer. This ensures the fabrication of the semiconductor device having the lightly doped channel regions each containing the activated impurity at a concentration lower than in the center portion of the channel region in both side portions of the channel region.

Since the fourth method of fabricating the semiconductor device further comprises the step of implanting indium ions to form the first-conductivity-type impurity layers as the pocket regions and then performing the high-temperature short-time heat treatment at a temperature of about 950° C. to 1050° C., the distribution of impurity concentration in the pocket regions has a peak in a shallower position and the extent to which the pocket regions expand is limited, while the expansion of the pocket regions by thermal diffusion is suppressed, similarly to the first method of fabricating the semiconductor device. This ensures the fabrication of the semiconductor device having the pocket regions disposed in spaced relation to the gate insulating film.

A sixth method of fabricating a semiconductor device comprises the steps of: ion implanting a first-conductivity-type impurity into a surface portion of a semiconductor substrate to form a first-conductivity-type semiconductor layer as a channel region; forming a gate electrode on the semiconductor substrate with a gate insulating film interposed therebetween; ion implanting an atom belonging to the Group IV into the semiconductor layer by using the gate electrode as a mask to form first-conductivity-type amorphous layers in upper regions of the semiconductor layer; ion implanting a second-conductivity-type impurity into the amorphous layers by using the gate electrode as a mask to form first second-conductivity-type impurity layers in the respective amorphous layers; depositing an insulating film over the entire surface of the semiconductor substrate at a temperature of about 600° C. to 850° C. to form first-conductivity-type lightly doped channel regions inwardly of the first second-conductivity-type impurity layers and in upper portions of the semiconductor layer, each of the lightly doped channel regions containing the impurity at a concentration lower than in the semiconductor layer; performing anisotropic etching with respect to the insulating film to form sidewalls on side surfaces of the gate electrode; and ion implanting a second-conductivity-type impurity into the first second-conductivity-type impurity layers and into the semiconductor layer by using the gate electrode and the sidewalls as a mask to form source/drain regions each composed of a second second-conductivity-type impurity layer in respective lower portions of the first second-conductivity-type impurity layers and the semiconductor layer located on both sides of the gate electrode and form second-conductivity-type extension regions inwardly of respective upper portions of the source/drain regions in the respective first second-conductivity-type impurity layers; and after removing the sidewalls, implanting indium ions into the semiconductor layer by using the gate electrode as a mask to form first-conductivity-type pocket regions inwardly of respective lower portions of the source/drain regions and in lower portions of the semiconductor layer.

Since the sixth method of fabricating the semiconductor device comprises the steps of: implanting indium ions to form the first-conductivity-type semiconductor layer as the channel region; implanting ions of an atom belonging to the Group IV to form the amorphous regions in the upper portions of the first-conductivity-type semiconductor layer; and ion implanting the second-conductivity-type impurity to form the first second-conductivity-type impurity layers as the extension regions and then performing the low-temperature long-time heat treatment at a temperature of about 600° C. to 850° C., the lightly doped channel regions each containing the activated impurity at a concentration lower than in the first-conductivity-type semiconductor layer can be formed efficiently inwardly of the respective first second-conductivity-type impurity layers in the first-conductivity-type semiconductor layer, similarly to the fourth method of fabricating the semiconductor device.

Since the sixth method of fabricating the semiconductor device further comprises the step of performing the high-temperature short-time heat treatment at a temperature of about 950° C. to 1050° C. after implanting indium ions to form the first-conductivity-type impurity layers as the pocket regions, the distribution of impurity concentration in the pocket regions has a peak in a shallow position and the extent to which the pocket regions expand is limited, while the expansion of the pocket regions by thermal diffusion is suppressed, similarly to the first method of fabricating the semiconductor device. This ensures the fabrication of the semiconductor device having the pocket regions disposed in spaced relation to the gate insulating film.

Since the sixth method of fabricating the semiconductor device further comprises the step of forming the amorphous layers in the upper portions of the first-conductivity-type semiconductor layer and then ion implanting the second-conductivity-type impurity to form the first second-conductivity-type impurity layers as the extension region, it sharpens the distribution of impurity concentration in the first second-conductivity-type impurity layers, similarly to the second method of fabricating the semiconductor device, so that the resistance of the extension regions is reduced.

A seventh method of fabricating a semiconductor device according to the present invention comprises the steps of: implanting indium ions into a surface portion of a semiconductor substrate to form a first-conductivity-type semiconductor layer as a channel region; forming a gate electrode on the semiconductor substrate with a gate insulating film interposed therebetween; ion implanting an atom belonging to the Group IV by using the gate electrode as a mask to form Group-IV-atom-ion implanted layers in upper portions of the semiconductor layer; performing a long-time first heat treatment with respect to the semiconductor substrate at a temperature of about 600° C. to 850° C. to form first-conductivity-type lightly doped impurity layers into respective upper portions of the Group-IV-atom-ion implanted layers and the semiconductor layer, each of the lightly doped impurity layers containing the activated impurity at a concentration lower than in the semiconductor layer; implanting indium ions into the semiconductor layer by using the gate electrode as a mask to form first-conductivity-type impurity layers in lower portions of the semiconductor layer; ion implanting a second-conductivity-type impurity into the semiconductor layer by using the gate electrode as a mask to form first second-conductivity-type impurity layers in upper portions of the semiconductor layer and form lightly doped channel regions composed of the first-conductivity-type lightly doped impurity layers inwardly of the respective first second-conductivity-type impurity layers; performing a short-time second heat treatment at a temperature of about 950° C. to 1050° C. with respect to the semiconductor substrate; forming sidewalls on side surfaces of the gate electrode; and ion implanting a second-conductivity-type impurity into the first second-conductivity-type impurity layers and into the first-conductivity-type impurity layers by using the gate electrode and the sidewalls as a mask to form source/drain regions each composed of a second second-conductivity-type impurity layer in respective regions of the first second-conductivity-type impurity layers and the first-conductivity-type impurity layers located on both sides of the gate electrode, form second-conductivity-type extension regions inwardly of respective upper portions of the source/drain regions in the respective first second-conductivity-type impurity layers, and form first-conductivity-type pocket regions inwardly of respective lower portions of the source/drain regions in the respective first-conductivity-type impurity layers.

Since the seventh method of fabricating the semiconductor device comprises the steps of: implanting indium ions to form the first-conductivity-type semiconductor layer as the channel region; ion implanting an atom belonging to the Group IV to form the Group-IV-atom-ion implanted layers; and performing the long-time first heat treatment at a temperature of about 600° C. to 850° C. with respect to the semiconductor substrate, the lightly doped channel regions each containing the activated impurity at a concentration lower than in the first-conductivity-type semiconductor layer can be formed efficiently inwardly of the respective first second-conductivity-type impurity layers in the first-conductivity-type semiconductor layer.

Since the seventh method of fabricating the semiconductor device further comprises the step of performing the high-temperature short-time heat treatment at a temperature of about 950° C. to 1050° C. after implanting indium ions to form the first-conductivity-type impurity layers as the pocket regions, the distribution of impurity concentration in the pocket regions has a peak in a shallow position and the extent to which the pocket regions expand is limited, while the expansion of the pocket regions by thermal diffusion is suppressed. This ensures the fabrication of the semiconductor device having the pocket regions disposed in spaced relation to the gate insulating film.

Since the seventh method of fabricating the semiconductor device implants indium ions to form the first-conductivity-type impurity layers as the pocket regions and then ion implants the second-conductivity-type impurity to form the first second-conductivity-type impurity layers as the extension regions, the phenomenon of the channeling of the second-conductivity-type impurity ions in the first second-conductivity-type impurity layers is suppressed. This sharpens the distribution of impurity concentration in the extension regions composed of the first second-conductivity-type impurity layers, so that the parasitic resistance of the extension regions is reduced and the short-channel effect is suppressed.

DETAILED DESCRIPTION OF THE INVENTION

Embodiment 1

Figure 1:
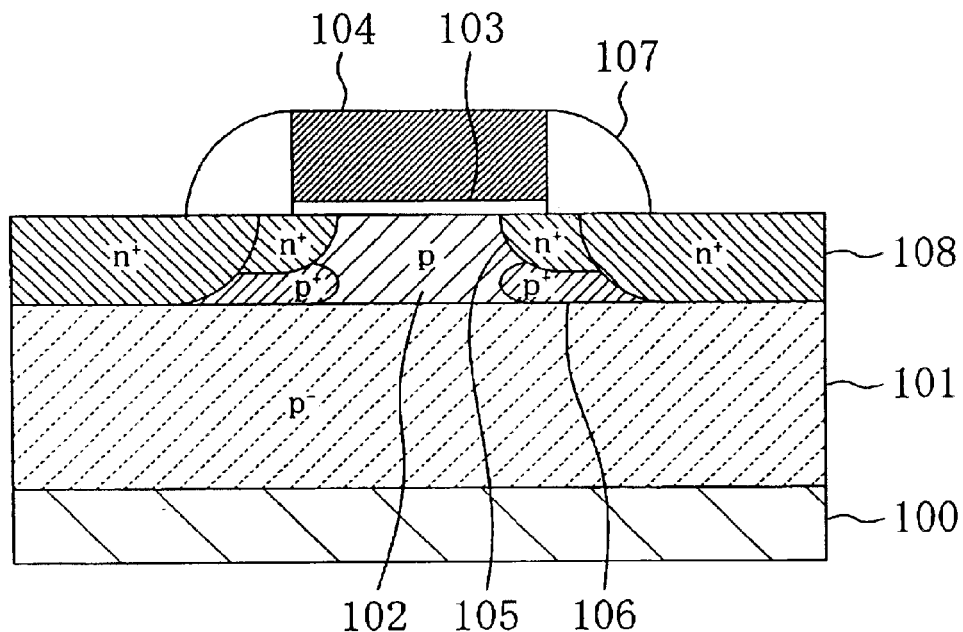
FIG. 1 is a cross-sectional view of a semiconductor device according to a first embodiment of the present invention.

Referring to FIG. 1, a semiconductor device according to a first embodiment of the present invention will be described.

As shown in FIG. 1, a p⁻-type well region 101 doped with a p-type impurity such as boron ions is formed in a semiconductor substrate 100 composed of a p-type silicon substrate. A gate electrode 104 composed of a polysilicon film is formed on the semiconductor substrate 100 with a gate insulating film 103 which is composed of, e.g., a silicon oxide film interposed therebetween. Sidewalls 107 composed of, e.g., a silicon oxide film are formed on the side surfaces of the gate electrode 104.

A p-type channel region 102 doped with a p-type impurity such as boron ions is formed in the region of a surface portion of the semiconductor substrate 100 located below the gate electrode 104, while source/drain regions 108 each composed of an n⁺-type activated impurity layer doped with an n-type impurity such as arsenic ions are formed in the respective regions of the surface portion of the semiconductor substrate 100 located on both sides of the gate electrode 104.

Between the channel region 102 and respective upper portions of the source/drain regions 108, there are formed n⁺-type extension regions 105 in contact relation with the source/drain regions 108.

Between the channel region 102 and respective lower regions of the source/drain regions 108, there are formed p⁺-type pocket regions 106 for punch-through suppression in contact relation with the source/drain regions 108.

The first embodiment is characterized in that the pocket regions 106 are doped with indium ions and formed in spaced relation to the gate insulating film 103.

According to the first embodiment, a depletion layer extending from the n⁺-type extension region 105 is generated first at a lower end portion of the extension region 105. However, since the p⁺-type pocket region 106 is formed below the extension region 105, the depletion layer extending from the n⁺-type extension region 105 is inhibited from expanding, so that the short-channel effect is suppressed.

Moreover, since the p⁺-type pocket regions 106 are formed in contact relation with the lower regions of the source/drain regions 108 and in spaced relation to the gate insulating film 103, i.e., the p⁺-type pocket regions 106 are not formed inwardly of the extension regions 105, impurity concentration in the extension regions 105 does not lower even if impurity concentration in the pocket regions 106 is increased to suppress the short-channel effect. This prevents an increase in the resistance of the extension region 105 and a decrease in the driving force of the MOS transistor.

Furthermore, since the p⁺-type pocket regions 106 are formed under the n⁺-type extension regions 105, i.e., the p⁺-type pocket regions 106 are not formed in contact relation with an upper region of the channel region 102, impurity concentration in the portion of the channel region 102 adjacent the extension region 105 does not increase even if impurity concentration in the pocket region 106 is increased. This prevents the lowering of the mobility of carriers due to impurity scattering in a carrier flow, a decrease in the driving force of the MOS transistor, and the occurrence of the reverse short-channel effect.

Embodiment 2

A semiconductor device according to a second embodiment of the present invention will be described with reference to FIG. 2.

Figure 2:
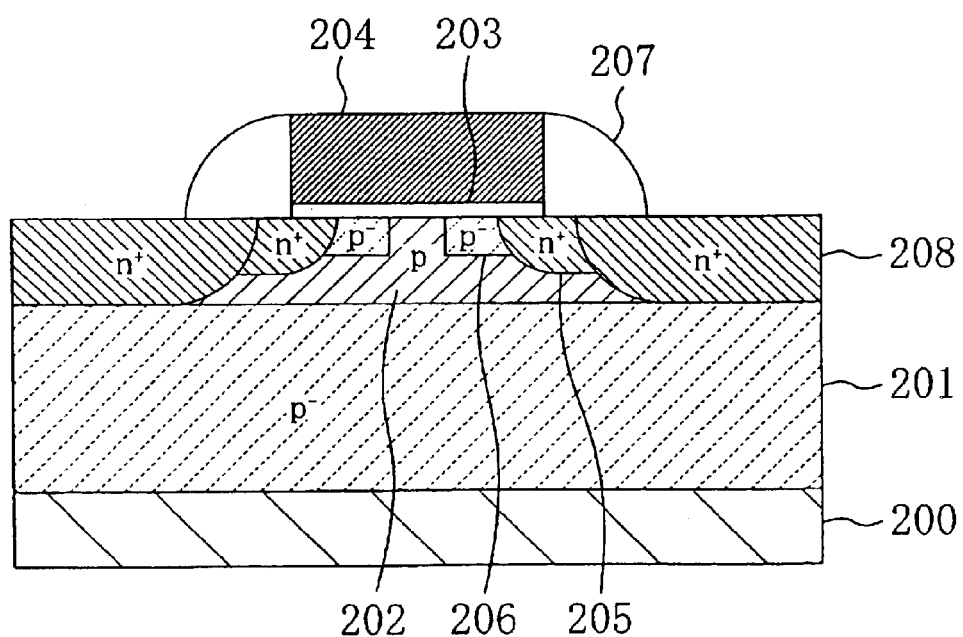
FIG. 2 is a cross-sectional view of a semiconductor device according to a second embodiment of the present invention.

As shown in FIG. 2, a p⁻-type well region 201 doped with a p-type impurity such as boron ions is formed in a semiconductor substrate 200 composed of a p-type silicon substrate. A gate electrode 204 composed of a polysilicon film is formed on the semiconductor substrate 200 with a gate insulating film 203 composed of, e.g., a silicon oxide film interposed therebetween. Sidewalls 207 composed of, e.g., a silicon oxide film are formed on the side surfaces of the gate electrode 204.

A p-type channel region 202 doped with indium ions as a p-type impurity is formed in the region of the surface portion of the semiconductor substrate 200 located below the gate electrode 204, while source/drain regions 208 each composed of an n⁺-type activated impurity layer doped with an n-type impurity such as arsenic ions are formed in the respective regions of the surface portion of the semiconductor substrate 200 located on both sides of the gate electrode 204.

Between the channel region 202 and respective upper portions of the source/drain regions 208, there are formed n⁺-type extension regions 205 in contact relation with the source/drain regions 208.

The second embodiment is characterized in that p⁻-type lightly doped channel regions 206 containing an activated impurity at a concentration lower than in the center portion of the channel region 202 is formed in both upper side portions of the p-type channel region 202 in contact relation with the extension regions 205.

According to the second embodiment, therefore, the concentration of the activated impurity in an upper portion of the channel region 202 is lower in both side portions thereof adjacent the source/drain regions 208 and higher in the middle portion thereof. Since the concentration of the activated impurity in the channel region 202 is lower in the portions thereof in contact with the n⁺-type extension regions 205, the resistance of the extension regions 205 is lowered, which prevents a decrease in the driving force of the MOS transistor.

Embodiment 3

A semiconductor device according to a third embodiment of the present invention will be described with reference to FIG. 3.

Figure 3:
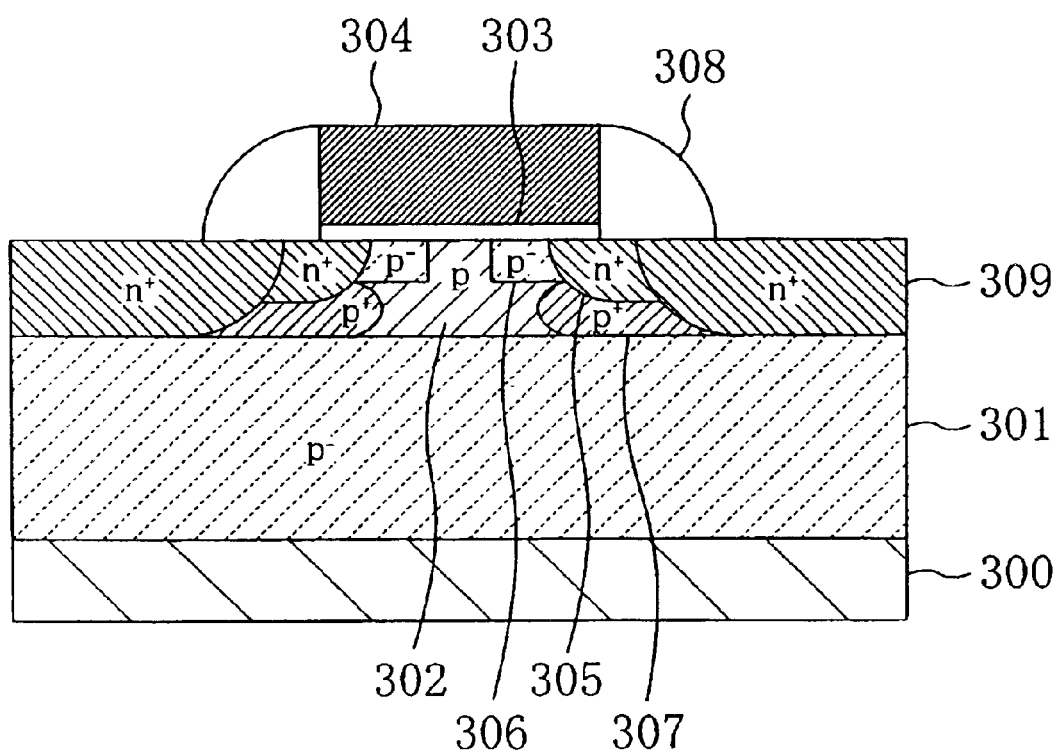
FIG. 3 is a cross-sectional view of a semiconductor device according to a third embodiment of the present invention.

As shown in FIG. 3, a p⁻-type well region 301 doped with a p-type impurity such as boron ions is formed in a semiconductor substrate 300 composed of a p-type silicon substrate. A gate electrode 304 is formed on the semiconductor substrate 300 with a gate insulating film 303 composed of, e.g., a silicon oxide film interposed therebetween. Sidewalls 308 composed of, e.g., a silicon oxide film are formed on the side surfaces of the gate electrode 304.

A p-type channel region 302 doped with indium ions as a p-type impurity is formed in the region of a surface portion of the semiconductor substrate 300 located below the gate electrode 304, while source/drain regions 309 each composed of an n⁺-type activated impurity layer doped with an n-type impurity such as arsenic ions are formed in the respective regions of the surface portion of the semiconductor substrate 300 located on both sides of the gate electrode 304.

Between the channel region 302 and respective upper portions of the source/drain regions 309, there are formed n⁺-type extension regions 305 in contact relation with the source/drain regions 309.

The third embodiment is characterized in that p⁻-type lightly doped channel regions 306 containing an activated impurity at a concentration lower than in the center portion of the channel region 302 are formed in both side portions of the p-type channel region 302 in contact relation with the extension regions 305.

Between the channel region 302 and respective lower portions of the source/drain regions 309, there are formed p$^+$-type pocket regions 307 for punch-through suppression in contact relation with the source/drain regions 309.

The third embodiment is characterized in that the pocket regions 307 are doped with indium ions and formed in spaced relation to the gate insulating film 303.

Since the third embodiment has formed the p$^+$-type pocket regions 307 under the extension regions 305, similarly to the first embodiment, the p$^+$-type pocket regions 307 suppress the expansion of depletion layers extending from the n$^+$-type extension regions 305, so that the short-channel effect is suppressed.

Since the p$^+$-type pocket regions 307 are formed in contact relation with the lower portions of the source/drain regions 309 and in spaced relation to the gate insulating film 303, i.e., the p$^+$-type pocket regions 307 are not formed inwardly of the extension regions 305, impurity concentration in the extension regions 305 does not lower even if impurity concentration in the pocket regions 307 is increased to suppress the short-channel effect. This prevents an increase in the resistance of the extension regions 305 and suppresses a decrease in the driving force of the MOS transistor.

Since the p$^+$-type pocket regions 307 are formed under the n$^+$-type extension regions 305, i.e., the p$^+$-type pocket regions 307 are kept from contact with an upper portion of the channel region 302, impurity concentration in the portions of the channel region 302 adjacent the extension regions 305 does not increase. This prevents the lowering of the mobility of carriers due to impurity scattering in a carrier flow, a decrease in the driving force of the MOS transistor, and the occurrence of the reverse short-channel effect.

According to the third embodiment, the p$^-$-type channel regions 306 containing the activated impurity at a concentration lower than in the center portion of the channel region 302 are formed in the upper side portions of the p-type channel region 302, similarly to the second embodiment. Accordingly, impurity concentration in the upper portion of the channel region 302 is lower in both side portions thereof adjacent the source/drain regions 308 and higher in the middle portion thereof. Since the concentration of the activated impurity is lower in the portions of the channel regions 302 in contact with the n$^+$-type extension regions 305, the resistance of the extension regions 305 can be reduced, which prevents a decrease in the driving force of the MOS transistor.

Embodiment 4

A method of fabricating a semiconductor device according to a fourth embodiment of the present invention will be described with reference to FIGS. 4(a) to (c) and FIGS. 5(a) to (c). It is to be noted that the fourth embodiment provides a first method of fabricating the semiconductor device according to the first embodiment.

Figure 4A:
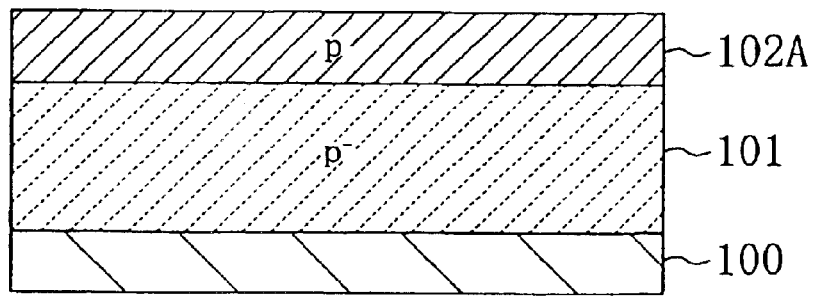
FIGS. 4(a) to (c) are cross-sectional views illustrating the individual process steps of a method of fabricating a semiconductor device according to a fourth embodiment of the present invention.

First, as shown in FIG. 4(a), the p$^-$-type well region 101 is formed by ion implanting a p-type impurity such as boron ions into the semiconductor substrate 100 composed of the p-type silicon substrate with an implant energy of 300 keV to 2000 keV and a dose of $1 \times 10^{13}$ cm$^{-2}$ to $1 \times 10^{14}$ cm$^{-2}$. Thereafter, a p-type impurity layer 102A is formed on the well region 101 by ion implanting a p-type impurity such as boron ions into the surface portion of the semiconductor substrate 100 with an implant energy of 20 keV to 60 keV and a dose of $4 \times 10^{12}$ cm$^{-2}$ to $1 \times 10^{13}$ cm$^{-2}$. The p-type impurity layer 102A may also be formed by ion implanting, as the p-type impurity, indium ions instead of the boron ions into the surface portion of the semiconductor substrate 100.

Figure 4B:
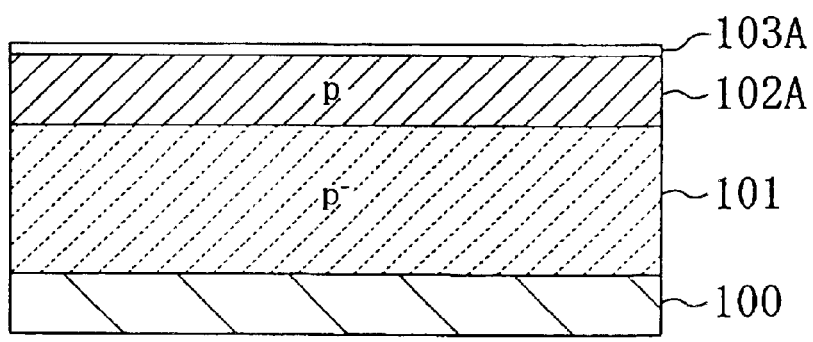

Next, as shown in FIG. 4(b), a surface of the semiconductor substrate 100 is oxidized such that a first silicon oxide film 103A having a thickness of 2 nm to 5 nm is formed.

Figure 4C:
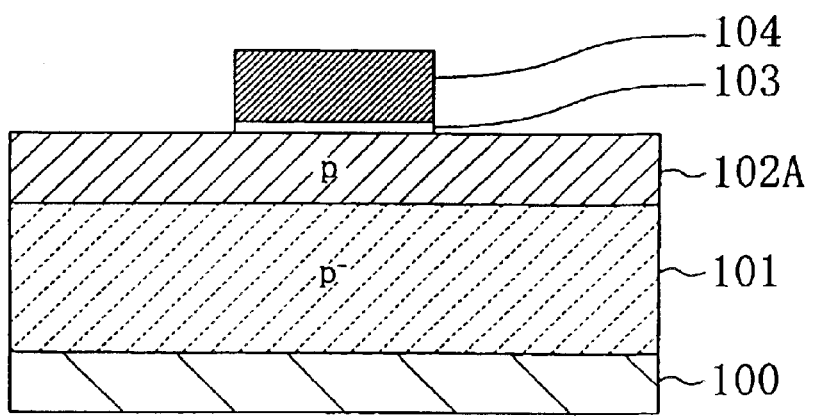

Next, a polysilicon film having a thickness of 200 nm to 300 nm is deposited over the entire surface of the first silicon oxide film 103A. Then, the polysilicon film and the first silicon oxide film 103A are patterned, thereby forming the gate insulating film 103 and the gate electrode 104, as shown in FIG. 4(c).

Figure 5A:
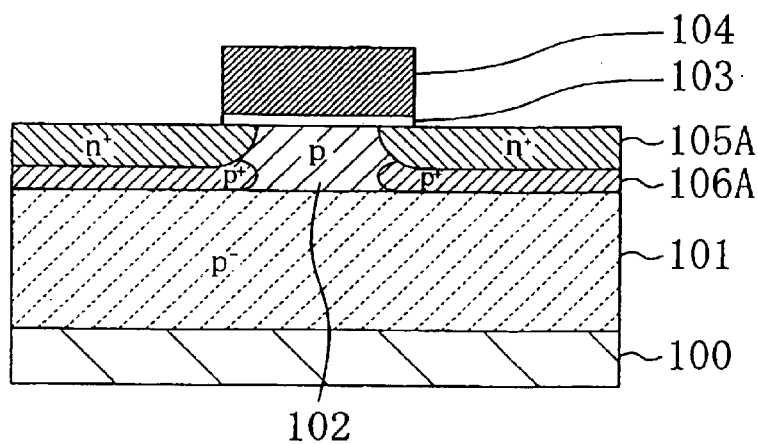
FIGS. 5(a) to (c) are cross-sectional views illustrating the individual process steps of the method of fabricating the semiconductor device according to the fourth embodiment of the present invention.

Next, as shown in FIG. 5(a), n$^+$-type impurity layers 105A are formed in upper portions of the p-type impurity layer 102A by ion implanting an n-type impurity such as arsenic ions into the p-type impurity layer 102A with an implant energy of 5 keV to 10 keV and a dose of $5 \times 10^{14}$ cm$^{-2}$ to $1 \times 10^{15}$ cm$^{-2}$ by using the gate electrode 104 as a mask.

Next, p$^+$-type impurity layers 106A are formed in lower portions of the p-type impurity layer 102A by ion implanting indium ions with an implant energy of 50 keV to 150 keV and a dose of $1 \times 10^{13}$ cm$^{-2}$ to $5 \times 10^{13}$ cm$^{-2}$ by using the gate electrode 104 as a mask. Thereafter, a first heat treatment, which is a high-temperature short-time heat treatment, is performed with respect to the semiconductor substrate 100 in an inert gas atmosphere at a temperature of, e.g., 1000° C. for 10 seconds.

Figure 5B:
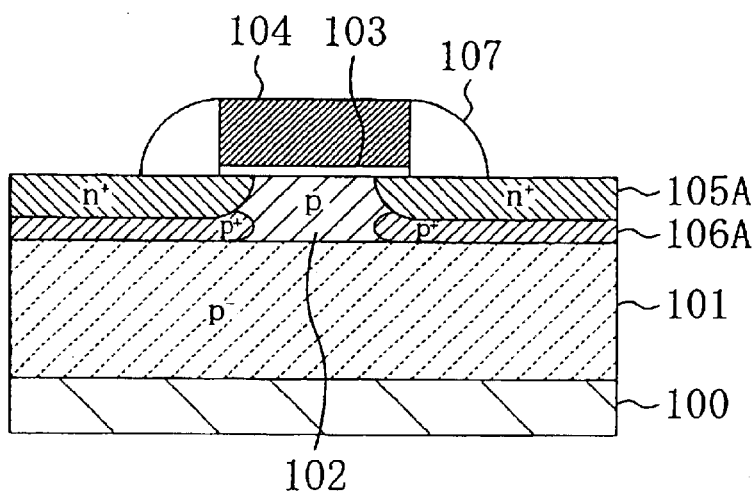

Next, a second silicon oxide film is deposited over the entire surface of the semiconductor substrate 100. Then, anisotropic etching is performed with respect to the second silicon oxide film, thereby forming the sidewalls 107 on the side surfaces of the gate electrode 104, as shown in FIG. 5(b).

Next, an n-type impurity, such as arsenic ions, is ion implanted into the n$^+$-type impurity layers 105A and the p$^+$-type impurity layers 106A, which are then subjected to a heat treatment for activating the arsenic ions. Thereafter, a second heat treatment, which is a high-temperature short-time heat treatment, is performed at a temperature of, e.g., 1000° C. for 10 seconds in order to eliminate crystal point defects.

Figure 5C:
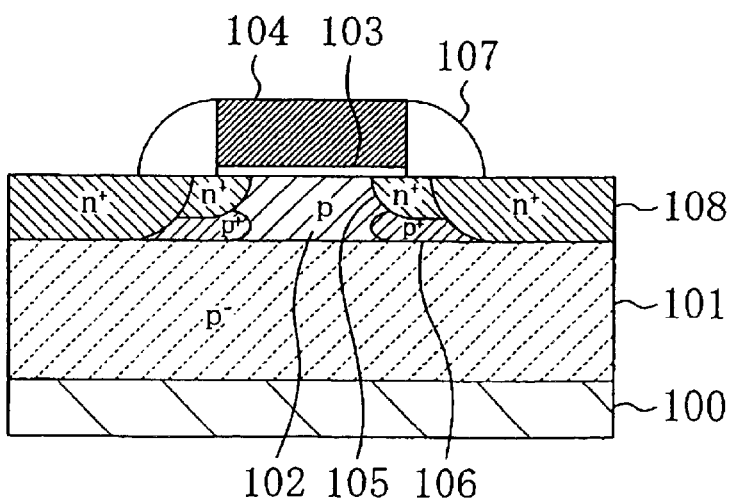

As a result, the source/drain regions 108 each composed of the n$^+$-type activated impurity layer are formed in the regions of the n$^+$-type impurity layers 105A and the p$^+$-type impurity layers 106A located on both sides of the gate electrode 104, the extension regions 105 composed of the n$^+$-type impurity layers 105A are formed inwardly of the respective upper portions of the source/drain regions 108 in the n$^+$-type impurity layers 105A, and the pocket regions 106 composed of the p$^+$-type impurity layers 106A are formed inwardly of the respective lower portions of the source/drain regions 108 in the p$^+$-type impurity layers 106A, as shown in FIG. 5(c).

According to the fourth embodiment, the p$^+$-type impurity layers 106A as the p$^+$-type pocket regions 106 are formed by implanting indium ions having an atomic mass larger than that of boron ions. As a consequence, the distribution of impurity concentration in the pocket regions 106 has a peak in a shallow position and the pocket regions 106 expand to a limited extent. Moreover, since the diffusion coefficient of indium ions in thermal equilibrium is about half the diffusion coefficient of boron ions, the expansion of the impurity ions by thermal diffusion can be suppressed more positively than in the case where boron ions are implanted.

Although the diffusion coefficient of indium ions in thermal equilibrium is lower than that of boron ions, the likelihood of indium ions undergoing transient enhanced diffusion due to point defects produced during ion implantation is as high as that of boron ions.

Therefore, the fourth embodiment has performed the high-temperature short-time first heat treatment immediately after forming the p$^+$-type impurity layers 106A by implanting indium ions and thereby suppressed the occurrence of transient enhanced diffusion due to the point defects. This suppresses the expansion of the pocket regions 106 composed of the p$^+$-type impurity layers 106A.

Since the fourth embodiment has thus formed the pocket regions 106 in contact relation to the respective lower portions of the source/drain regions 108 and in spaced relation to the gate insulating film 103, the semiconductor device according to the first embodiment can be fabricated reliably.

Although the fourth embodiment has performed the high-temperature short-time first heat treatment at a temperature of 1000° C. for 10 seconds, it is not limited thereto. The effect of suppressing the expansion of the pocket regions 106 is achievable provided that the temperature range is about 950 to 1050° C. and the time range is about 0.1 to 30 seconds. If the temperature of the first high-temperature short-time heat treatment is lower than about 950° C., point defects are produced so that indium ions undergo transient enhanced diffusion. If the temperature of the first high-temperature short-time heat treatment is higher than about 1050° C., on the other hand, transient enhanced diffusion due to the point defects does not occur but the indium ions themselves are diffused. Therefore, the high-temperature short-time first heat treatment is preferably performed in the temperature range of about 950 to 1050° C.

Figure 6A:
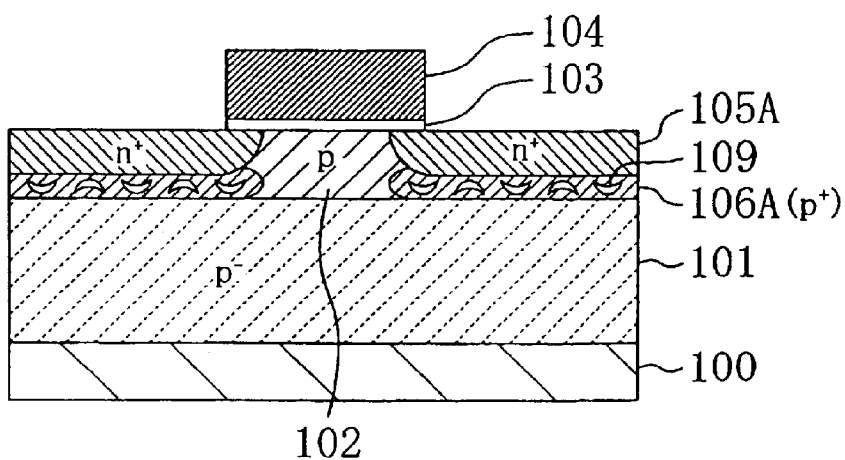
FIGS. 6(a) and (b) are cross-sectional views for illustrating the problems of a conventional method of fabricating a semiconductor device.
Figure 6B:
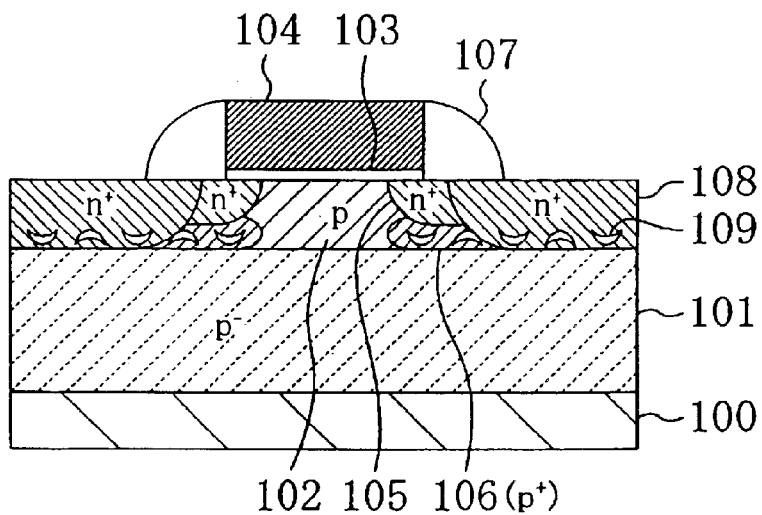

In the ion implantation step for forming the p$^+$-type impurity layers 106A as the pocket regions 106, a silicon crystal is amorphized if the ion implantation is performed with a dose higher than $5 \times 10^{13}$ cm$^{-2}$. As a consequence, EOR (End of Range) point defects 109 such as dislocation loops are produced in the p$^+$-type impurity layers 106A, as shown in FIG. 6(a). The production of the EOR point defects 109 is substantially independent of the temperature or time of the heat treatment after the ion implantation. Once the EOR point defects 109 are produced, they are difficult to eliminate completely even if a heat treatment is performed thereafter. As a consequence, the EOR point defects 109 remain even after the final MOS transistor is obtained, as shown in FIG. 6(b).

When a bias voltage is applied to the extension regions 105 so as to operate the MOS transistor, depletion layers expand from the extension regions 105 toward the pocket regions 106. If the EOR point defects 109 exist in the pocket regions 106, the depletion layers reach the EOR point defects 109, whereby a junction leakage current is generated. If a VLSI chip having such a MOS transistor is incorporated in mobile communication equipment, the junction leakage current undesirably increases power consumption during standby.

However, since the fourth embodiment has implanted the indium ions with a dose of $5 \times 10^{13}$ cm$^{-2}$ or lower in the ion implantation step for forming the p$^+$-type impurity layers 106A as the pocket regions 106, the silicon crystal is not amorphized in the p$^+$-type impurity layers 106A and the EOR point defects 109 are not produced in the p$^+$-type impurity layers 106A, so that a junction leakage current is less likely to be generated.

Embodiment 5

A method of fabricating a semiconductor device according to a fifth embodiment of the present invention will be described with reference to FIGS. 7(a) to (c) and FIGS. 8(a) to (c). It is to be noted that the fifth embodiment provides a second method of fabricating the semiconductor device according to the first embodiment.

First, as shown in FIG. 6(a), the p$^-$-type well region 101 is formed by ion implanting a p-type impurity such as boron ions into the semiconductor substrate 100 composed of the p-type silicon substrate with an implant energy of 300 keV to 2000 keV and a dose of $1 \times 10^{13}$ cm$^{-2}$ to $1 \times 10^{14}$ cm$^{-2}$. Thereafter, a p-type impurity layer 102A is formed on the well region 101 by ion implanting a p-type impurity such as boron ions into the surface portion of the semiconductor substrate 100 with an implant energy of 20 keV to 60 keV and a dose of $4 \times 10^{12}$ cm$^{-2}$ to $1 \times 10^{13}$ cm$^{-2}$.

Figure 7A:
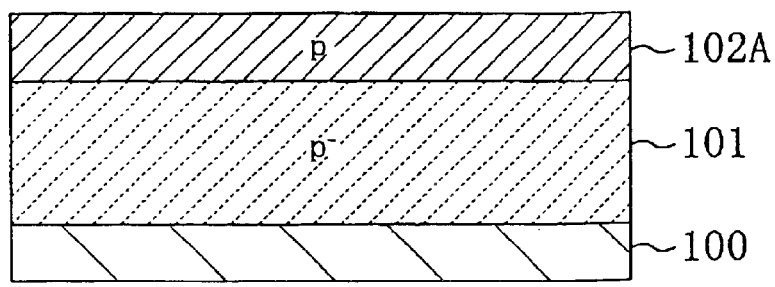
FIGS. 7(a) to (c) are cross-sectional views illustrating the individual process steps of a method of fabricating a semiconductor device according to a fifth embodiment of the present invention.
Figure 7B:
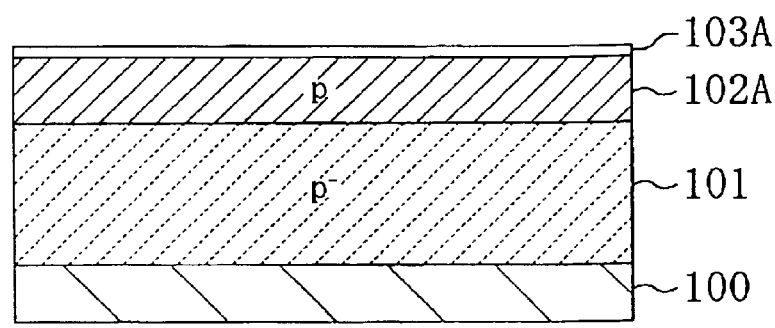

Next, as shown in FIG. 7(b), the surface of the semiconductor substrate 100 is oxidized to form a first silicon oxide film 103A having a thickness of 2 nm to 5 nm.

Figure 7C:
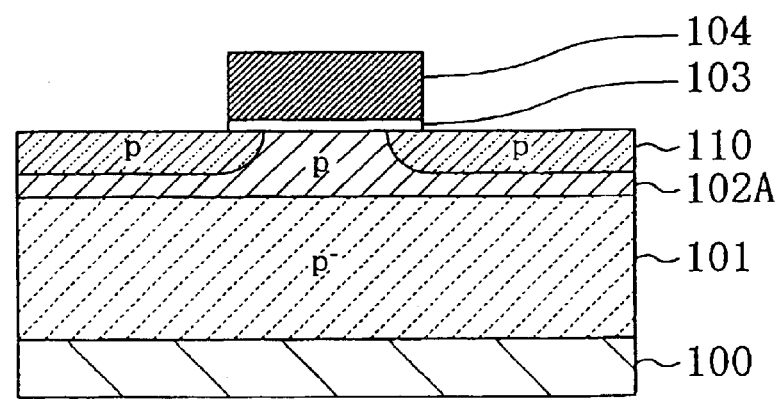

Next, a polysilicon film having a thickness of about 200 nm to 300 nm is deposited over the entire surface of the first silicon oxide film 103A. Then, the polysilicon film and the first silicon oxide film 103A are patterned to form the gate insulating film 103 and the gate electrode 104, as shown in FIG. 7(c).

Next, p-type amorphous layers 110 are formed in upper portions of the p-type impurity layer 102A by implanting ions of an atom belonging to the Group IV, such as germanium ions, into the p-type impurity layer 102A with an implant energy of 5 keV to 10 keV and a dose of $5 \times 10^{14}$ cm$^{-2}$ to $1 \times 10^{15}$ cm$^{-2}$ by using the gate electrode 104 as a mask.

Figure 8A:
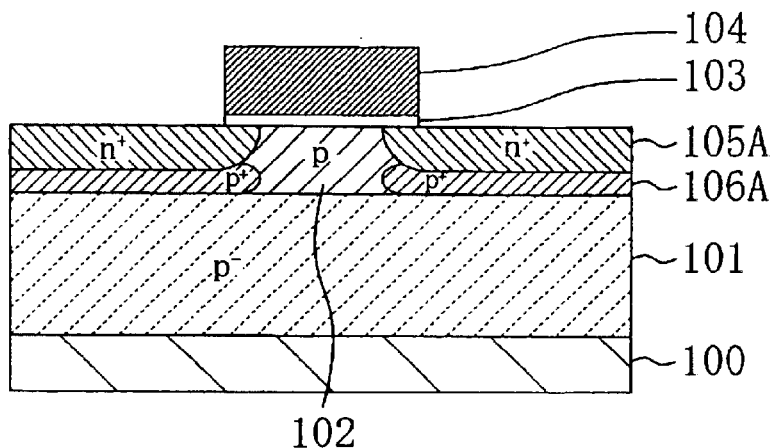
FIGS. 8(a) to (c) are cross-sectional views illustrating the individual process steps of the method of fabricating the semiconductor device according to the fifth embodiment of the present invention.

Next, as shown in FIG. 8(a), n$^+$-type impurity layers 105A are formed in the amorphous layers 110 by ion implanting an n-type impurity such as arsenic ions into the p-type amorphous layers 110 with an implant energy of 5 keV to 10 keV and a dose of $5 \times 10^{14}$ cm$^{-2}$ to $1 \times 10^{15}$ cm$^{-2}$ by using the gate electrode 104 as a mask.

Next, p$^+$-type impurity layers 106A are formed in the lower portions of the p-type impurity layer 102A by ion implanting indium ions into the p-type impurity layer 102A with an implant energy of 50 to 150 keV and a dose of $1 \times 10^{13}$ cm$^{-2}$ to $5 \times 10^{13}$ cm$^{-2}$ by using the gate electrode 104 as a mask. Thereafter, a first heat treatment, which is a high-temperature short-time heat treatment, is performed with respect to the semiconductor substrate 100 in an inert gas atmosphere at a temperature of, e.g. 1000° C. for 10 seconds.

Figure 8B:
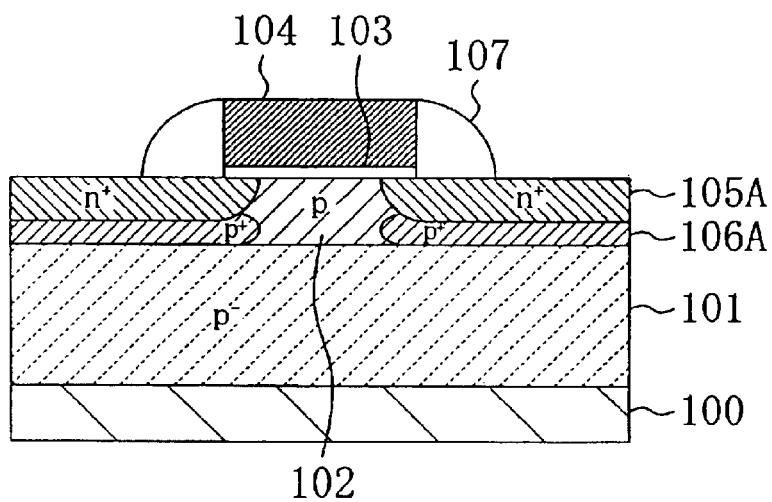

Next, a second silicon oxide film is deposited over the entire surface of the semiconductor substrate 100. Then, anisotropic etching is performed with respect to the second silicon oxide film, thereby forming the sidewalls 107 on the side surfaces of the gate electrode 104, as shown in FIG. 8(b).

Next, an n-type impurity such as arsenic ions is ion implanted into the n$^+$-type impurity layers 105A and the p$^+$-type impurity layers 106A, which are then subjected to a heat treatment for activating the arsenic ions. Thereafter, a second heat treatment, which is a high-temperature short-time heat treatment, is performed at a temperature of 1000° C. for 10 seconds in order to eliminate the crystal point defects.

Figure 8C:
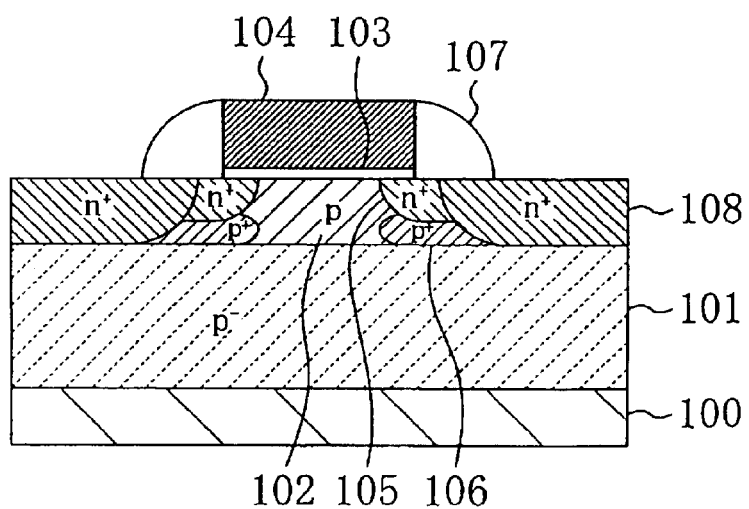

As a result, the source/drain regions 108 each composed of the n$^+$-type activated impurity layer are formed in the regions of the n$^+$-type impurity layers 105A and the p$^+$-type impurity layers 106A located on both sides of the gate electrode 104, the extension regions 105 composed of the n$^+$-type impurity layers 105A are formed inwardly of the respective upper portions of the source/drain regions 108 in the n$^+$-type impurity layers 105A, and the pocket regions 106 composed of the p$^+$-type impurity layers 106A are formed inwardly of the respective lower portions of the source/drain regions 108 in the p$^+$-type impurity layers 106A, as shown in FIG. 8(c).

Since the fifth embodiment has formed the p$^+$-type impurity layers 106A as the p$^+$-type pocket regions 106 by implanting indium ions having an atomic mass larger than that of boron ions and performed the high-temperature short-time first heat treatment after implanting the indium ions, similarly to the fourth embodiment, the expansion of the pocket regions 106 can be suppressed. This allows the p$^+$-type impurity layers 106A as the p$^+$-type pocket regions 106 to be formed in spaced relation to the gate insulating film 3.

Since the fifth embodiment has implanted the indium ions with a dose of 5×10$^{13}$ cm$^{-2}$ or lower in the ion implantation step for forming the p$^+$-type impurity layer 106A as the pocket regions 106, similarly to the fourth embodiment, the silicon crystal is not amorphized in the p$^+$-type impurity layers 106A and EOR point defects 109 are not produced in the p$^+$-type impurity layers 106A, so that a junction leakage current is less likely to be generated.

The distribution of impurity concentration in the n$^+$-type impurity layers 105A formed by the implantation of arsenic ions to serve as the n$^+$-type extension regions 105 is less likely to be sharpened.

Since the fifth embodiment has formed the amorphous layers 110 by implanting germanium ions and then formed the n$^+$-type impurity layers 105A by implanting arsenic ions, the distribution of impurity concentration in the extension regions 105 composed of the n$^+$-type impurity layers 105A is sharpened, so that the resistance of the extension regions 105 is lowered.

Figure 9A:
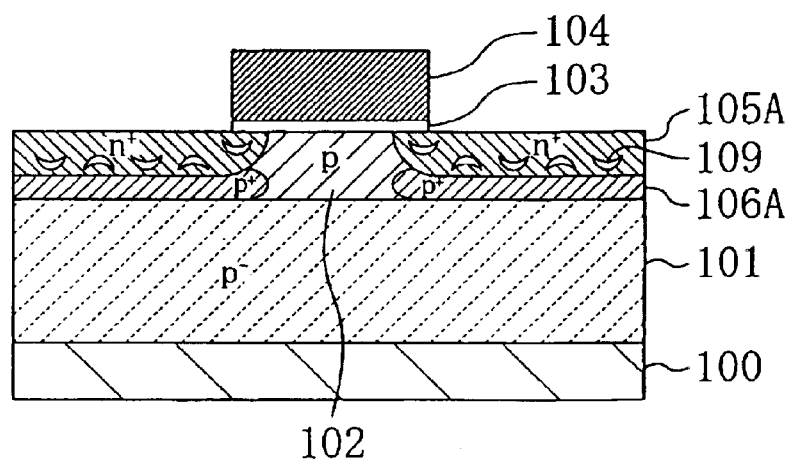
FIGS. 9(a) and (b) are cross-sectional views illustrating the individual process steps of the method of fabricating the semiconductor device according to the fifth embodiment of the present invention.
Figure 9B:
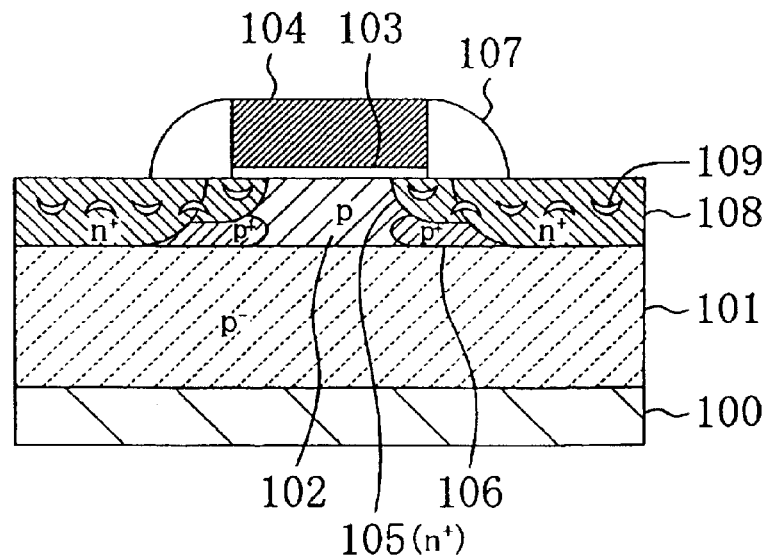

It is preferable to implant the germanium ions into a portion shallower than the portion implanted with the arsenic ions for forming the n$^+$-type impurity layers 105A as the extension regions 105 and thereby prevent the amorphous layers 110 from expanding downwardly to positions lower than the n$^+$-type impurity layers 105A. This prevents the EOR point defects 109 caused by the subsequent heat treatment from expanding downwardly to positions lower than the n$^+$-type impurity layers 105A, as shown in FIG. 9(a). That is, the EOR point defects 109 are not produced in the pocket regions 106, as shown in FIG. 9(b).

As a consequence, there can be prevented a situation in which a junction leakage current is generated even when depletion layers expand from the extension regions 105 toward the pocket regions 106 and reach the EOR point defects when a bias voltage is applied to the extension regions 105.

Although the fifth embodiment has used the germanium ions as ions for forming the amorphous layers 110, the same effects are achievable if ions of another atom belonging to the Group IV such as silicon ions or carbon ions are used instead of the germanium ions.

Embodiment 6

A method of fabricating a semiconductor device according to a sixth embodiment of the present invention will be described with reference to FIGS. 10(a) to (c) and FIGS. 11(a) and (b). It is to be noted that the sixth embodiment provides a first method of fabricating the semiconductor device according to the second embodiment.

Figure 10A:
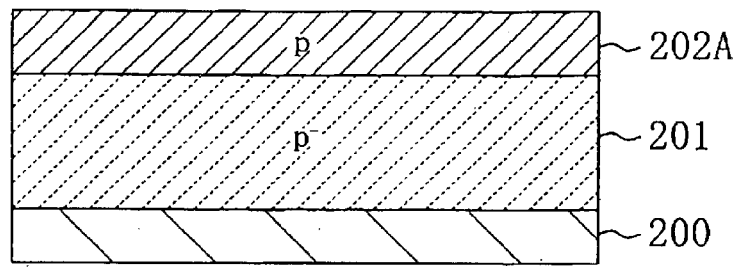
FIGS. 10(a) to (c) are cross-sectional views illustrating the individual process steps of a method of fabricating a semiconductor device according to a sixth embodiment of the present invention.

First, as shown in FIG. 10(a), the p$^-$-type well region 201 is formed by ion implanting a p-type impurity such as boron ions into the semiconductor substrate 200 composed of the p-type silicon substrate with an implant energy of 300 keV to 2000 keV and a dose of 1×10$^{13}$ cm$^{-2}$ to 1×10$^{14}$ cm$^{-2}$. Thereafter, a p-type impurity layer 202A is formed on the well region 201 by implanting indium ions into the surface portion of the semiconductor substrate 200 with an implant energy of 50 keV to 150 keV and a dose of 5×10$^{12}$ cm$^{-2}$ to 1×10$^{14}$ cm$^{-2}$.

Figure 10B:
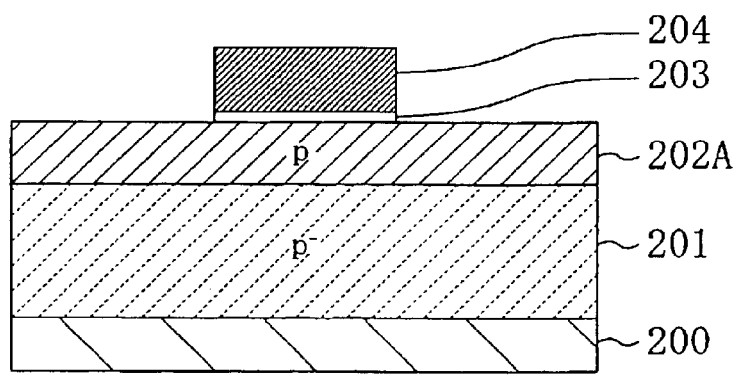

Next, a surface of the semiconductor substrate 200 is oxidized to form a first silicon oxide film having a thickness of 2 nm to 5 nm. Subsequently, a polysilicon film having a thickness of about 200 nm to 300 nm is deposited over the entire surface of the first silicon oxide film. Then, the polysilicon film and the first silicon oxide film are patterned to form the gate insulating film 203 and the gate electrode 204, as shown in FIG. 10(b).

Figure 10C:
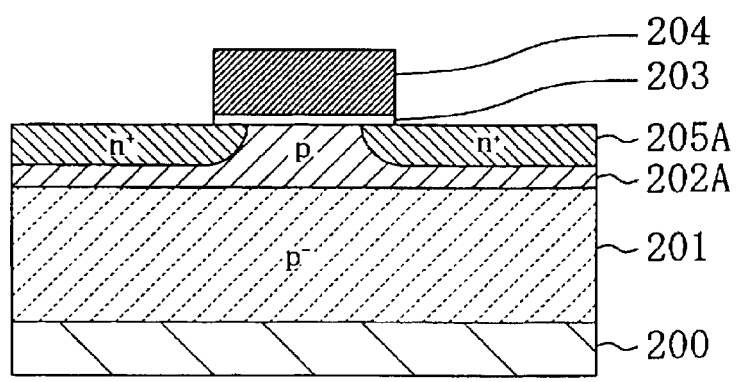

Next, as shown in FIG. 10(c), n$^+$-type impurity layers 205 are formed in upper portions of the p-type impurity layer 202A by ion implanting an n-type impurity such as arsenic ions into the p-type impurity layer 202A with an implant energy of 5 to 10 keV and a dose of 5×10$^{14}$ cm$^{-2}$ to 1×10$^{15}$ cm$^{-2}$ by using the gate electrode 204 as a mask.

Figure 11A:
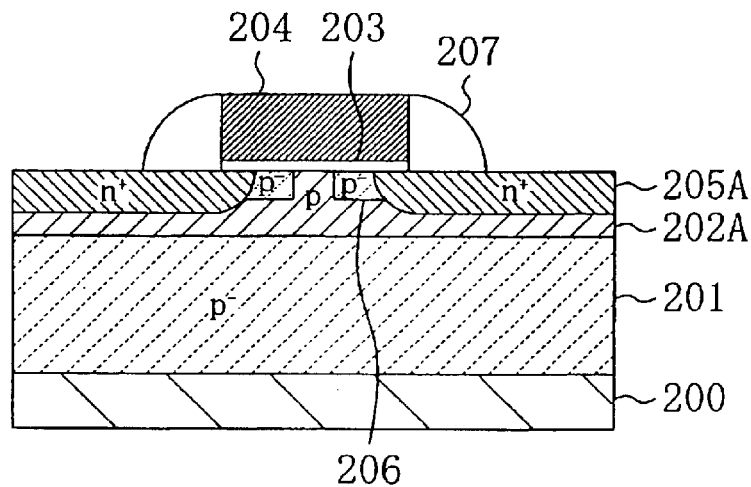
FIGS. 11(a) and (b) are cross-sectional views illustrating the individual process steps of the method of fabricating the semiconductor device according to the sixth embodiment of the present invention.
Figure 11B:
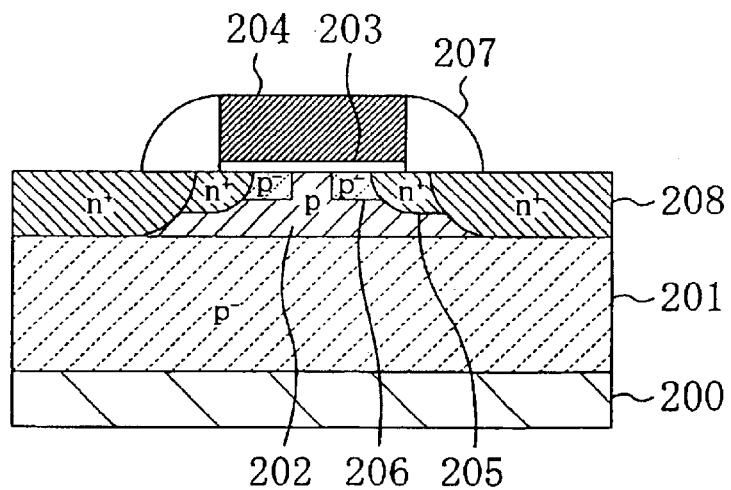

Next, a second silicon oxide film is deposited over the entire surface of the semiconductor substrate 200 at a temperature of about 600° C. to 850° C. for about 10 minutes to 200 minutes. Then, anisotropic etching is performed with respect to the second silicon oxide film, thereby forming the sidewalls 207 composed of the second silicon oxide film on the side surfaces of the gate electrode 204, as shown in FIG. 11(a). It follows that a first heat treatment, which is a low-temperature long-time heat treatment, has been performed with respect to the semiconductor substrate 200 in the step of depositing the second silicon oxide film. As a result, the p$^-$-type lightly doped channel regions 206 containing the activated impurity at a concentration lower than in the p-type impurity layer 202A are formed inwardly of the n$^+$-type impurity layers 205A and in the upper portions of the p-type impurity layer 202A.

Next, an n-type impurity such as arsenic ions is ion implanted into the n$^+$-type impurity layers 205A and the p-type impurity layer 202A. Then, a heat treatment is performed to activate the arsenic ions. Thereafter, a second heat treatment, which is a high-temperature short-time heat treatment, is performed at a temperature of 1000° C. for 10 seconds.

As a result, the source/drain regions 208 each composed of the n$^+$-type activated impurity layer are formed in the regions of the n$^+$-type impurity layers 205A and the p$^+$-type impurity layer 202A located on both sides of the gate electrode 204 and the extension regions 205 composed of the n$^+$-type impurity layers 205A are formed inwardly of the respective upper portions of the source/drain regions 208 in the n$^+$-type impurity layers 205A, as shown in FIG. 11(c).

Since the sixth embodiment has formed the p$^+$-type impurity layer 202A on the well region 201 by implanting the indium ions and performed the low-temperature long-time heat treatment with respect to the semiconductor substrate 200 after the n$^+$-type impurity layers 205A are formed, the p-type lightly doped channel regions 206 containing the activated impurity at a concentration lower than in the p-type impurity layer 202A can be formed inwardly of the n$^+$-type impurity layers 205A and in the upper portions of the p-type impurity layer 202A. A description will be given below to the mechanism of the formation of the p$^-$-type lightly doped channel regions 206.

It has been known that an indium ion is bonded to an interstitial silicon and thereby inactivated (e.g., P. Bouillonet et. al., "Anomalus short channel effects in Indium implanted nMOSFETs", Digest of Tech. Report of IEDM, 1997).

An interstitial silicon atom generated in the p-type impurity layer 202A when the N$^+$-type impurity layers 205A are formed by implanting arsenic ions moves toward the gate insulating film 203 as a result of the low-temperature long-time heat treatment performed subsequently.

Since the sixth embodiment has formed the p-type impurity layer 202A by implanting indium ions, indium ions present in the regions of the p-type impurity layer 202A (regions in contact with the extension regions 205) underlying the both side portions of the gate insulating film 203 are bonded to interstitial silicon atoms that have moved from the n⁺-type impurity layers 205A toward the gate insulating film 203 and thereby inactivated. As a consequence, the p⁻-type lightly doped channel regions 206 containing the activated impurity at a concentration lower than in the p-type impurity layer 202A are formed in the regions of the p-type impurity layer 202A underlying the both side portions of the gate insulating film 203, i.e., inwardly of the n⁺-type impurity layers 205A and in the upper portions of the p-type impurity layer 202A.

Since the sixth embodiment has formed the p-type impurity layer 202A as the channel region 202 by implanting indium ions, it can prevent the lowering of the mobility of carriers in the channel region 202 for the following reason. That is, since indium ions have an atomic mass larger than that of boron ions, the distribution of concentration has a peak in a lower portion of the p-type impurity layer 202A so that a so-called retrograde channel is formed in which the concentration of the indium ions decreases with approach toward the surface. As a result, the lowering of the mobility of carriers in the channel region is less likely to occur so that the driving force of the MOS transistor is increased.

Embodiment 7

A method of fabricating a semiconductor device according to a seventh embodiment of the present invention will be described with reference to FIGS. 12($a$) to ($c$) and FIGS. 13($a$) to ($c$) It is to be noted that the seventh embodiment provides a second method of fabricating the semiconductor device according to the second embodiment.

Figure 12A:
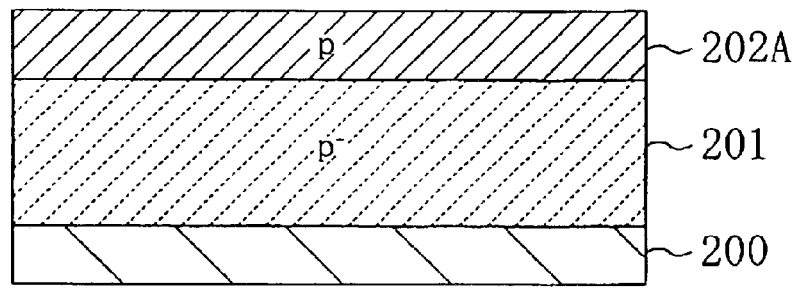
FIGS. 12(a) to (c) are cross-sectional views illustrating the individual process steps of a method of fabricating a semiconductor device according to a seventh embodiment of the present invention.
Figure 12B:
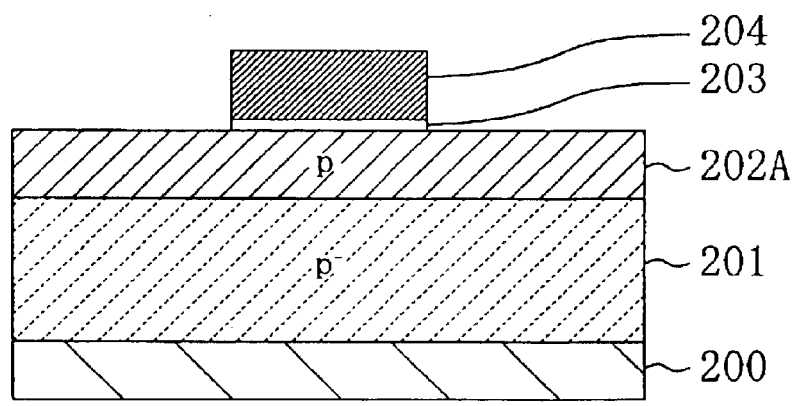
Figure 12C:
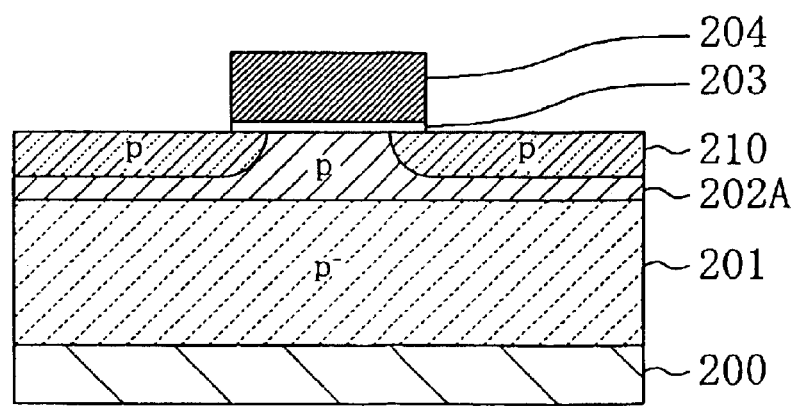

First, as shown in FIG. 12($a$), the p⁻-type well region 201 is formed by ion implanting a p-type impurity such as boron ions into the semiconductor substrate 200 composed of the p-type silicon substrate with an implant energy of 300 keV to 2000 keV and a dose of $1\times10^{13}$ cm⁻² to $1\times10^{14}$ cm². Thereafter, a p-type impurity layer 202A is formed on the well region 201 by implanting indium ions into the surface portion of the semiconductor substrate 200 with an implant energy of 50 keV to 150 keV and a dose of $5\times10^{12}$ cm⁻² to $1\times10^{14}$ cm⁻².

Next, a surface of the semiconductor substrate 200 is oxidized to form a first silicon oxide film having a thickness of 2 nm to 5 nm. Subsequently, a polysilicon film having a thickness of about 200 nm to 300 nm is deposited over the entire surface of the first silicon oxide film. Then, the polysilicon film and the first silicon oxide film are patterned to form the gate insulating film 203 and the gate electrode 204, as shown in FIG. 12($b$).

Next, as shown in FIG. 12($c$), p-type amorphous layers 210 are formed in upper portions of the p-type impurity layer 102A by implanting ions of an atom belonging to the Group IV, such as germanium ions, into the p-type impurity layer 202A with an implant energy of 5 keV to 10 keV and at $5\times10^{14}$ cm⁻² to $1\times10^{15}$ cm⁻² by using the gate electrode 204 as a mask.

Figure 13A:
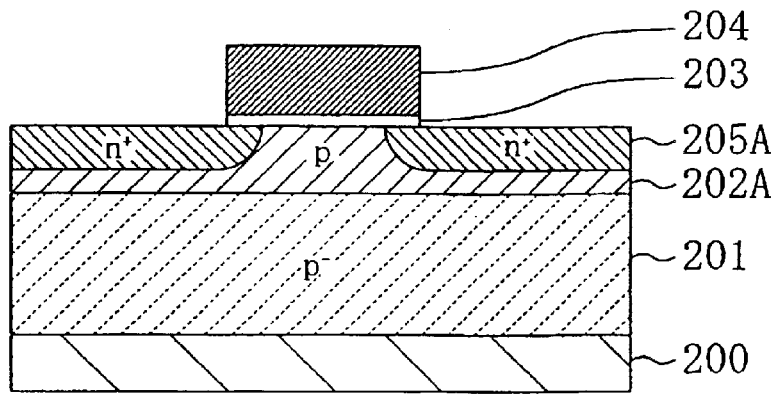
FIGS. 13(a) to (c) are cross-sectional views illustrating the individual process steps of the method of fabricating the semiconductor device according to the seventh embodiment of the present invention.
Figure 13B:
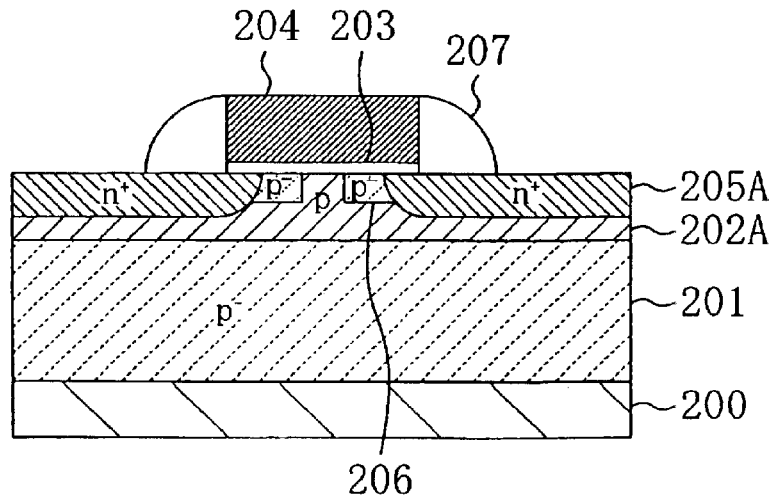
Figure 13C:
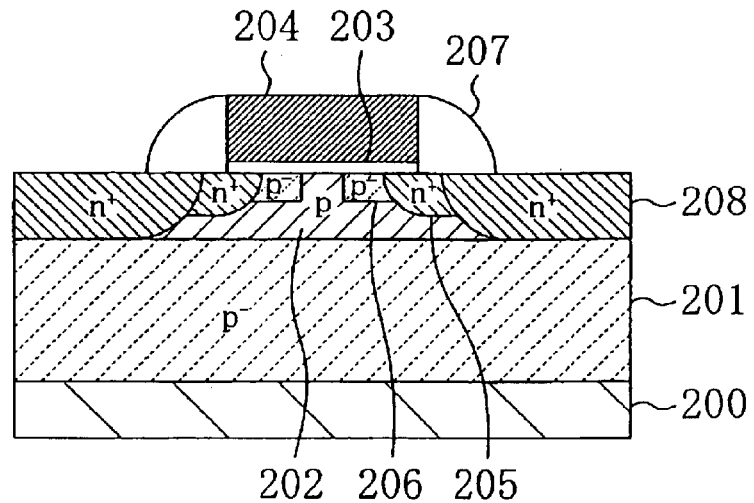

Next, as shown in FIG. 13($a$), n⁺-type impurity layers 205A are formed in the amorphous layers 210 by ion implanting an n-type impurity such as arsenic ions into the p-type amorphous layers 210 with an implant energy of 5 to 10 keV and a dose of $5\times10^{14}$ cm⁻² to $1\times10^{15}$ cm⁻² by using the gate electrode 204 as a mask.

Next, a second silicon oxide film is deposited over the entire surface of the semiconductor substrate 200 at a temperature of about 600° C. to 850° C. for about 10 minutes to 200 minutes. Then, anisotropic etching is performed with respect to the second silicon oxide film, thereby forming the sidewalls 208 composed of the second silicon oxide film on the side surfaces of the gate electrode 204, as shown in FIG. 13($b$). It follows that a first heat treatment, which is low-temperature long-time heat treatment, has been performed with respect to the semiconductor substrate 200 in the step of depositing the second silicon oxide film. As a result, the p⁻-type lightly doped channel regions 206 containing the activated impurity at a concentration lower than in the p-type impurity layer 202A are formed inwardly of the n⁺-type impurity layers 205A and in the upper portions of the p-type impurity layer 202A.

Next, an n-type impurity such as arsenic ions is ion implanted into the n⁺-type impurity layers 205A and the p-type impurity layer 202A. Then, a heat treatment is performed to activate the arsenic ions. Thereafter, a second heat treatment, which is a high-temperature short-time heat treatment, is performed at a temperature of 1000° C. for 10 seconds.

As a result, the source/drain regions 208 each composed of the n⁺-type activated impurity layer are formed in the regions of the n⁺-type impurity layers 205A and the p⁺-type impurity layer 202A located on both sides of the gate electrode 204 and the extension regions 205 composed of the n⁺-type impurity layers 205A are formed inwardly of the respective upper portions of the source/drain regions 208 in the n⁺-type impurity layers 205A, as shown in FIG. 13($c$).

Since the seventh embodiment has formed the p-type impurity layer 202A by implanting indium ions and performed the low-temperature long-time heat treatment with respect to the semiconductor substrate 200 after forming the n⁺-type impurity layers 205A, the p⁻-type lightly doped channel regions 206 containing the activated impurity at a concentration lower than in the p-type impurity layer 202A are formed inwardly of the n⁺-type impurity layers 205A and in the upper portions of the p-type impurity layer 202A. The mechanism of the formation of the p⁻-type lightly doped channel regions 206 is the same as in the sixth embodiment.

Since the seventh embodiment has formed the n⁺-type impurity layers 205A by implanting arsenic ions and formed the amorphous layers 210 by implanting germanium ions, the number of interstitial silicon atoms generated in the p-type impurity layer 202A is larger than in the case of the sixth embodiment (in the case where germanium ions are not implanted). Accordingly, the number of bonds between indium ions present in the regions of the p-type impurity layer 202A underlying the both side portions of the gate insulating film 203 and the interstitial silicon atoms is larger than in the case of the sixth embodiment. As a result, the indium ions are further inactivated in the regions of the p-type impurity layer 202A underlying the both side portions of the gate insulating film 203, i.e., inwardly of the n⁺-type impurity layers 205A and in the upper portions of the p-type impurity layer 202A. This allows more efficient formation of the p⁻-type lightly doped channel regions 206.

Since the seventh embodiment has formed the amorphous layers 210 by implanting germanium ions and then formed the n⁺-type impurity layers 205A by implanting arsenic ions, the distribution of impurity concentration in the extension regions 205 composed of the n⁺-type impurity layers 205A becomes sharp, so that the resistance of the extension regions 205 is lowered.

Since the seventh embodiment has formed the p-type impurity layer 202A as the channel region 202 by implanting indium ions, it can form a so-called retrograde channel, similarly to the sixth embodiment. As a result, the lowering of the mobility of carriers in the channel region 202 can be prevented.

Embodiment 8

A method of fabricating a semiconductor device according to an eighth embodiment of the present invention will be described with reference to FIGS. 14(a) to (c) and FIGS. 15(a) to (c) It is to be noted that the eighth embodiment provides a first method of fabricating the semiconductor device according to the third embodiment.

Figure 14A:
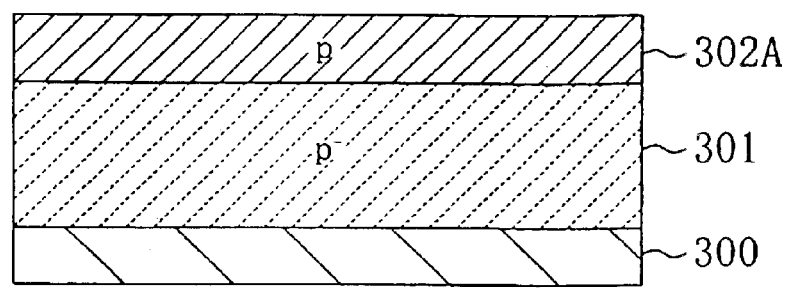
FIGS. 14(a) to (c) are cross-sectional views illustrating the individual process steps of a method of fabricating a semiconductor device according to an eighth embodiment of the present invention.

First, as shown in FIG. 14(a), the p⁻-type well region 301 is formed by ion implanting a p-type impurity such as boron ions into the semiconductor substrate 300 composed of the p-type silicon substrate with an implant energy of 300 keV to 2000 kev and a dose of $1 \times 10^{13}$ cm$^{-2}$ to $1 \times 10^{14}$ cm$^{-2}$. Thereafter, a p-type impurity layer 302A is formed on the well region 301 by implanting indium ions into the surface portion of the semiconductor substrate 300 with an implant energy of 50 keV to 150 keV and a dose of $5 \times 10^{12}$ cm$^{-2}$ to $1 \times 10^{14}$ cm$^{-2}$.

Figure 14B:
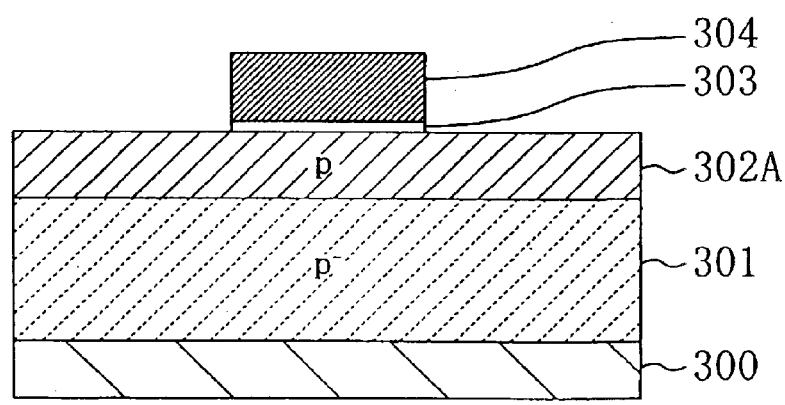

Next, a surface of the semiconductor substrate 300 is oxidized to form a first silicon oxide film having a thickness of 2 nm to 5 nm. Subsequently, a polysilicon film having a thickness of about 200 nm to 300 nm is deposited over the entire surface of the first silicon oxide film. Then, the polysilicon film and the first silicon oxide film are patterned to form the gate insulating film 303 and the gate electrode 304, as shown in FIG. 14(b).

Figure 14C:
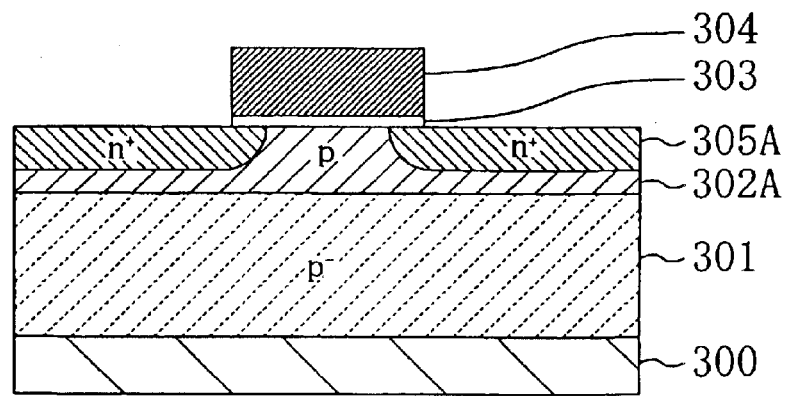

Next, as shown in FIG. 14(c), n⁺-type impurity layers 305 are formed in upper portions of the p-type impurity layer 302A by ion implanting an n-type impurity such as arsenic ions into the p-type impurity layer 302A with an implant energy of 5 to 10 keV and a dose of $5 \times 10^{14}$ cm$^{-2}$ to $1 \times 10^{15}$ cm$^{-2}$ by using the gate electrode 304 as a mask.

Figure 15A:
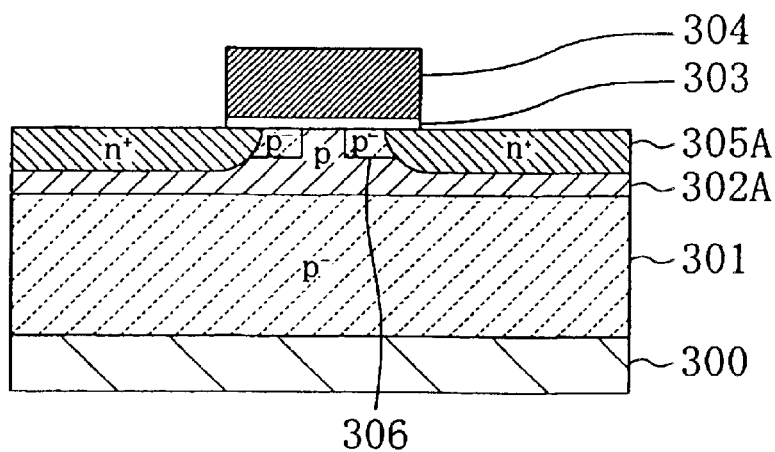
FIGS. 15(a) to (c) are cross-sectional views illustrating the individual process steps of the method of fabricating the semiconductor device according to the eighth embodiment of the present invention.
Figure 15B:
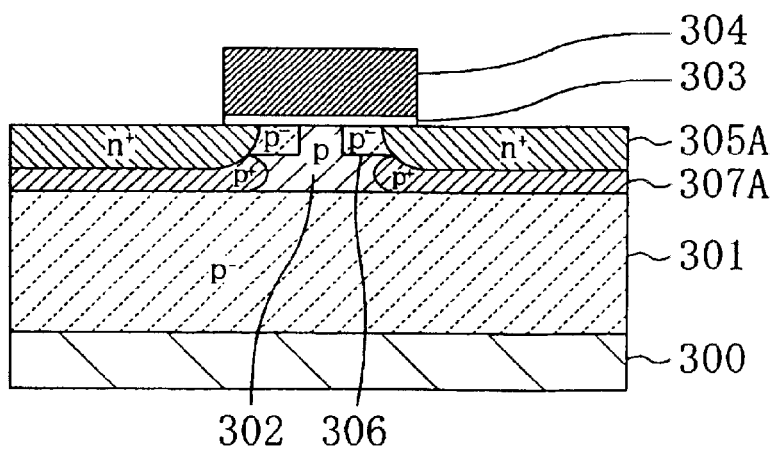

Next, a first heat treatment, which is a low-temperature long-time heat treatment, is performed with respect to the semiconductor substrate 300 at a temperature of about 600 to 850° C. for about 10 minutes to 200 minutes, whereby the p⁻-type lightly doped channel regions 306 containing the impurity at a concentration lower than in the p-type impurity layer 302A is formed inwardly of the n⁺-type impurity layers 305A and in the upper portions of the p-type impurity layer 302A, as shown in FIG. 15(a).

Next, p⁺-type impurity layers 307A are formed in lower portions of the p-type impurity layer 302A by implanting indium ions with an implant energy of 50 keV to 150 keV and a dose of $5 \times 10^{12}$ cm$^{-2}$ to $1 \times 10^{14}$ cm$^{-2}$ by using the gate electrode 304 as a mask. Thereafter, a second heat treatment, which is a high-temperature short-time heat treatment, is performed with respect to the semiconductor substrate 300 in an inert gas atmosphere at a temperature of, e.g., 1000° C. for 10 seconds.

Next, a second silicon oxide film is deposited over the entire surface of the semiconductor substrate 300. Then, anisotropic etching is performed with respect to the second silicon oxide film, thereby forming the sidewalls 308 on the side surfaces of the gate electrode 304, as shown in FIG. 15(a).

Next, an n-type impurity, such as arsenic ions, is ion implanted into the n⁺-type impurity layers 305A and the p⁺-type impurity layers 307A, which are then subjected to a heat treatment for activating the arsenic ions. Thereafter, a third heat treatment, which is a high-temperature short-time heat treatment, is performed at a temperature of 1000° C. for 10 seconds in order to eliminate crystal point defects.

Figure 15C:
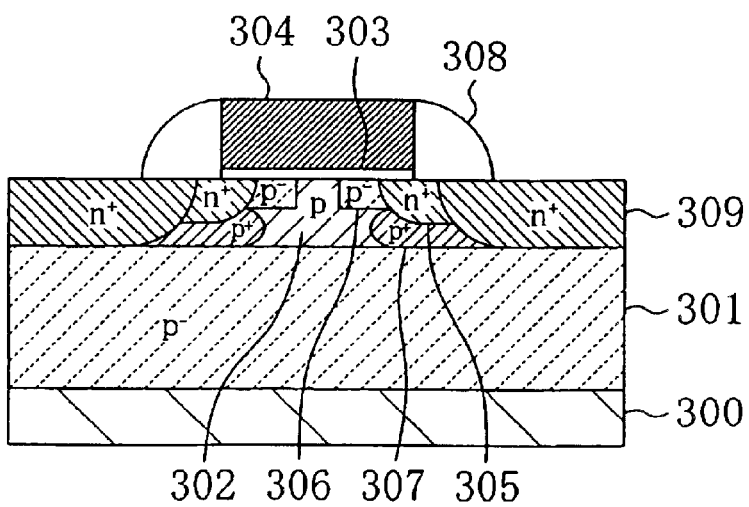

As a result, the source/drain regions 309 each composed of the n⁺-type activated impurity layer are formed in the regions of the n⁺-type impurity layers 305A and p⁺-type impurity layers 306A located on both sides of the gate electrode 304, the extension regions 305 composed of the n⁺-type impurity layers 305A are formed inwardly of the respective upper portions of the source/drain regions 308 in the n⁺-type impurity layers 305A, and the pocket regions 307 composed of the p⁺-type impurity layers 307A are formed inwardly of the respective lower portions of the source/drain regions 308 in the p⁺-type impurity layers 307A, as shown in FIG. 15(c).

Since the eighth embodiment comprises the steps of forming the p-type impurity layer 302A by implanting indium ions and performing the low-temperature long-time heat treatment with respect to the semiconductor substrate 300 after forming the n⁺-type impurity layers 305A, the p⁻-type lightly doped channel regions 306 containing the activated impurity at a concentration lower than in the p-type impurity 302A can be formed inwardly of the n⁺-type impurity layers 305A and in the upper portions of the p-type impurity layer 302A. The mechanism of the formation of the p⁻-type lightly doped channel regions 306 is the same as in the sixth embodiment.

Since the eighth embodiment has formed the p⁺-type impurity layers 307A as the pocket regions 307 by implanting indium ions having an atomic mass larger than that of boron ions and then performed the high-temperature short-time second heat treatment, similarly to the fourth embodiment, the occurrence of transient enhanced diffusion due to the point defects is suppressed, so that the expansion of the pocket regions 307 composed of the p⁺-type impurity layers 307A is suppressed. This allows formation of the p⁺-type impurity layers 307A as the pocket regions 307 in spaced relation to the gate insulating film 303.

Although the eighth embodiment has performed the first high-temperature short-time heat treatment at a temperature of 1000° C. for 10 seconds, it is not limited thereto. The effect of suppressing the expansion of the pocket regions 307 is achievable provided that the temperature range is about 950 to 1050° C. and the time range is about 0.1 to 30 seconds.

Since the eighth embodiment has formed the p-type impurity layer 302A as the channel region 302 by implanting indium ions, a so-called retrograde channel can be formed, similarly to the sixth embodiment. As a result, the lowering of the mobility of carriers in the channel region 302 can be prevented.

Embodiment 9

A method of fabricating a semiconductor device according to a ninth embodiment of the present invention will be described with reference to FIGS. 16(a) to (c) and FIGS. 17(a) to (c). It is to be noted that the ninth embodiment provides a second method of fabricating the semiconductor device according to the third embodiment.

Figure 16A:
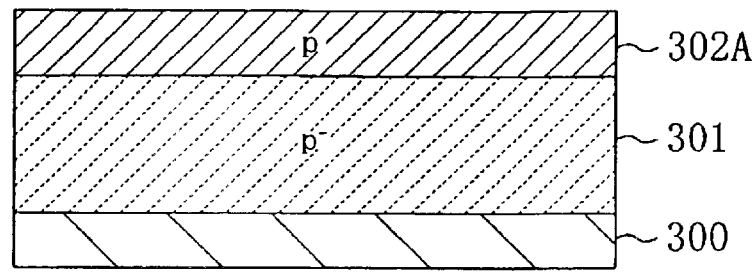
FIGS. 16(a) to (c) are cross-sectional views illustrating the individual process steps of a method of fabricating a semiconductor device according to a ninth embodiment of the present invention.

First, as shown in FIG. 16(a), the p⁻-type well region 301 is formed by ion implanting a p-type impurity such as boron ions into the semiconductor substrate 300 composed of the p-type silicon substrate with an implant energy of 300 kev to 2000 keV and a dose of $1 \times 10^{13}$ cm$^{-2}$ to $1 \times 10^{14}$ cm$^{-2}$. Thereafter, a p-type impurity layer 302A is formed on the well region 301 by implanting indium ions into the surface portion of the semiconductor substrate 300 with an implant energy of 20 keV to 200 keV and a dose of $4 \times 10^{12}$ cm$^{-2}$ to $1 \times 10^{13}$ cm$^{-2}$.

Figure 16B:
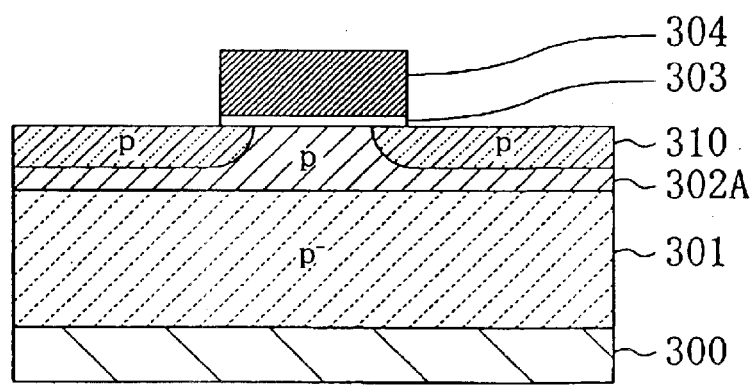

Next, a surface of the semiconductor substrate 300 is oxidized to form a first silicon oxide film having a thickness of 2 nm to 5 nm. Subsequently, a polysilicon film having a thickness of about 200 nm to 300 nm is deposited over the entire surface of the first silicon oxide film. Then, the polysilicon film and the first silicon oxide film are patterned to form the gate insulating film 303 and the gate electrode 304, as shown in FIG. 16(b).

Next, p-type amorphous layers 310 are formed in upper portions of the p-type impurity layer 302A by implanting ions of an atom belonging to the Group IV, such as germanium ions, into the p-type impurity layer 302A with an implant energy of 5 keV to 10 keV and at $5 \times 10^{14}$ cm$^{-2}$ to $1 \times 10^{15}$ cm$^{-2}$ by using the gate electrode 304 as a mask.

Figure 16C:
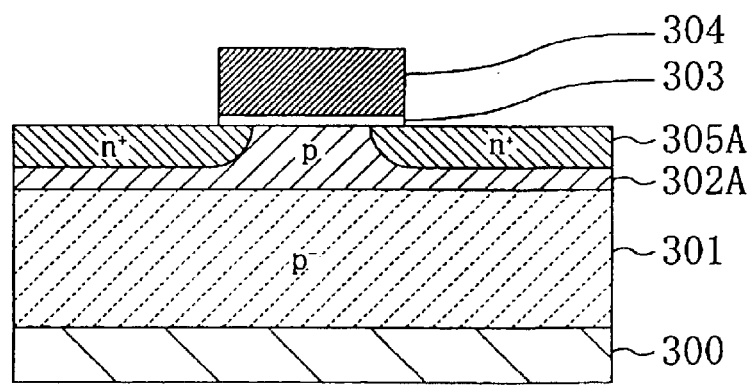

Next, as shown in FIG. 16(c), n$^+$-type impurity layers 305A are formed in the amorphous layers 310 by ion implanting an n-type impurity, such as arsenic ions, into the amorphous layers 310 with an implant energy of 5 keV to 10 keV and a dose of $5 \times 10^{14}$ cm$^{-2}$ to $1 \times 10^{15}$ cm$^{-2}$ by using the gate electrode 304 as a mask.

Figure 17A:
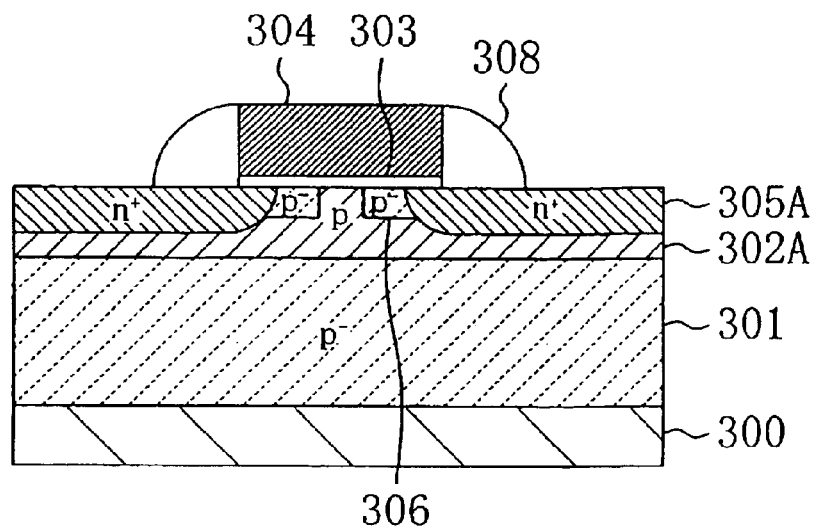
FIGS. 17(a) to (c) are cross-sectional views illustrating the individual process steps of the method of fabricating the semiconductor device according to the ninth embodiment of the present invention.

Next, a second silicon oxide film is deposited over the entire surface of the semiconductor substrate 300 at a temperature of about 600° C. to 850° C. for about 10 minutes to 200 minutes. Then, anisotropic etching is performed with respect to the second silicon oxide film to form the sidewalls 308 composed of the second silicon oxide film on the side surfaces of the gate electrode 304, as shown in FIG. 17(a). It follows that a first heat treatment, which is a low-temperature long-time heat treatment, has been performed with respect to the semiconductor substrate 300 in the step of depositing the second silicon oxide film. As a result, the p-type lightly doped channel regions 306 containing the activated impurity at a concentration lower than in the p-type impurity layer 302A are formed inwardly of the n$^+$-type impurity layers 305A and in the upper portions of the p-type impurity layer 302A.

Figure 17B:
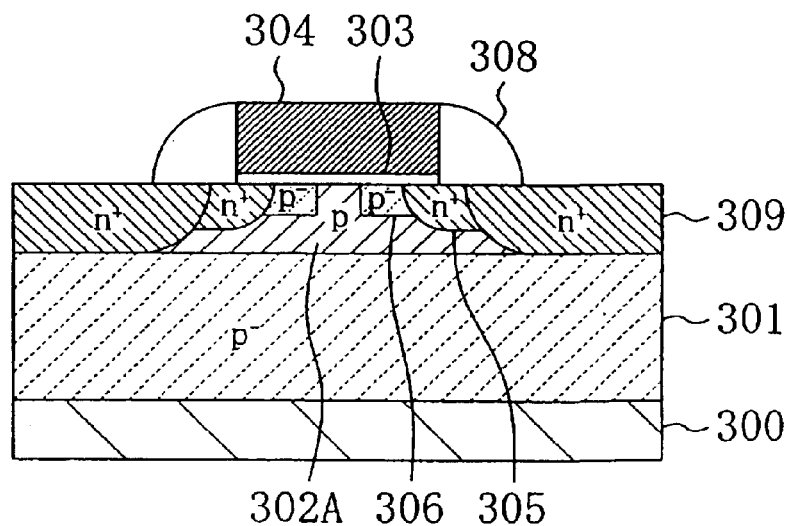

Next, as shown in FIG. 17(b), an n-type impurity such as arsenic ions is ion implanted into the n$^+$-type impurity layers 305A and the p-type impurity layer 302A, whereby the source/drain regions 309 each composed of the n$^+$-type impurity layer are formed in the respective regions of the n$^+$-type impurity layers 305A and the p-type impurity layer 302A located on both sides of the gate electrode 304 and the extension regions 305 composed of the n$^+$-type impurity layers 305A are formed inwardly of the upper portions of the source/drain regions 309 in the n$^+$-type impurity layers 305A.

Figure 17C:
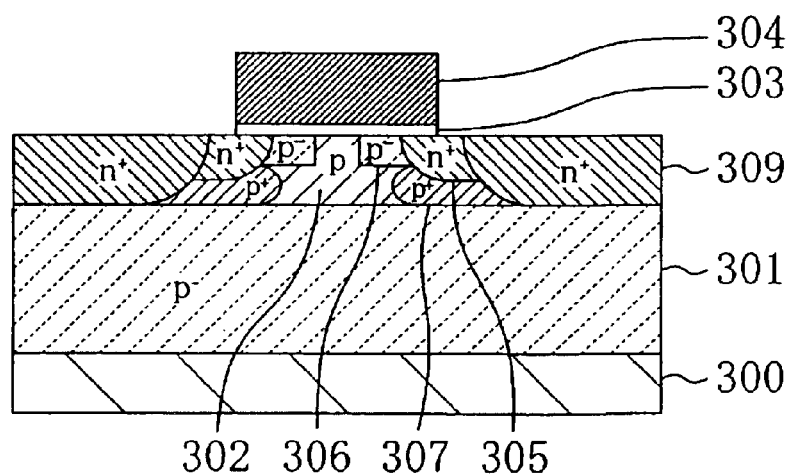

Next, as shown in FIG. 17(c), the sidewalls 308 are removed and then indium ions are implanted into the p-type impurity layer 302A with an implant energy of 100 to 200 keV and a dose of $1 \times 10^{13}$ cm$^{-2}$ to $4 \times 10^{13}$ cm$^{-2}$ by using the gate electrode 304 as a mask, whereby the p$^+$-type pocket regions 307 are formed under the extension regions 305 inwardly of the source/drain regions 309 and in the lower portions of the p-type impurity layer 302A.

Next, a second heat treatment, which is high-temperature short-time heat treatment, is performed at a temperature of, e.g., 1000° C. for 10 seconds with respect to the semiconductor substrate 300, thereby activating the arsenic ions in the source/drain regions 309 and eliminating the crystal point defects.

Since the ninth embodiment has performed the steps of forming the p-type impurity layer 302A by implanting indium ions, forming the amorphous layers 310 by implanting germanium ions, and performing the low-temperature long-time heat treatment with respect to the semiconductor substrate 300 after forming the n$^+$-type impurity layers 305A, the p$^-$-type lightly doped channel regions 306 containing the activated impurity at a concentration lower than in the p-type impurity 302A can be formed efficiently inwardly of the n$^+$-type impurity layers 305A and in the upper portions of the p-type impurity layer 302A, similarly to the seventh embodiment.

Since the ninth embodiment has formed the amorphous layers 310 by implanting germanium ions and formed the n$^+$-type impurity layers 305A by implanting arsenic ions, the distribution of impurity concentration in the extension regions 305 composed of the n$^+$-type impurity layers 305A becomes sharp, so that the resistance of the extension regions 305 is lowered.

In addition, since the ninth embodiment has formed the p$^+$-type pocket regions 307 by implanting indium ions having an atomic mass larger than that of boron ions and performed the high-temperature short-time second heat treatment immediately thereafter, similarly to the fourth embodiment, the expansion of the p$^+$-type pocket regions 307 can be suppressed. This allows formation of p$^+$-type impurity layers 307A as the p$^+$-type pocket regions 307 in spaced relation to the gate insulating film 303.

Furthermore, since the ninth embodiment has formed the p-type impurity layer 302A as the channel region 302 by implanting indium ions, a so-called retrograde channel can be formed, similarly to the sixth embodiment. As a result, the lowering of the mobility of carriers in the channel region 302 can be prevented.

Embodiment 10

A method of fabricating a semiconductor device according to a tenth embodiment of the present invention will be described with reference to FIGS. 18(a) to (c) and FIGS. 19(a) to (c). It is to be noted that the tenth embodiment provides a third method of fabricating the semiconductor device according to the third embodiment.

Figure 18A:
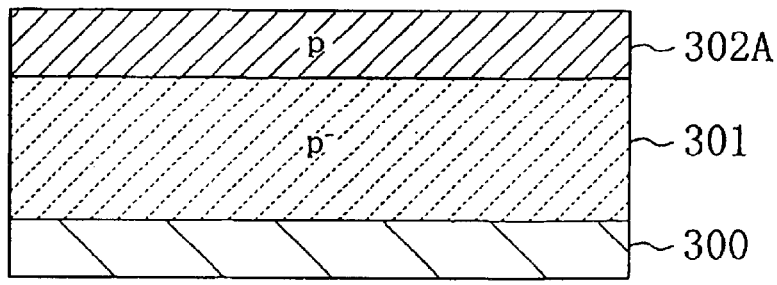
FIGS. 18(a) to (c) are cross-sectional views illustrating the individual process steps of a method of fabricating a semiconductor device according to a tenth embodiment of the present invention.

First, as shown in FIG. 18(a), the p$^-$-type well region 301 is formed by ion implanting a p-type impurity such as boron ions into the semiconductor substrate 300 composed of the p-type silicon substrate with an implant energy of 300 keV to 2000 keV and a dose of $1 \times 10^{13}$ cm$^{-2}$ to $1 \times 10^{14}$ cm$^{-2}$. Thereafter, a p-type impurity layer 302A is formed on the well region 301 by implanting indium ions into the surface portion of the semiconductor substrate 300 with an implant energy of 20 keV to 200 keV and a dose of $4 \times 10^{12}$ cm$^{-2}$ to $1 \times 10^{13}$ cm$^{-2}$.

Figure 18B:
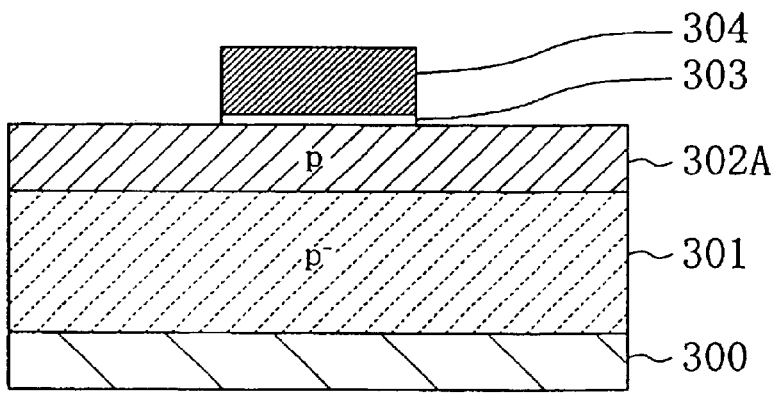
Figure 18C:
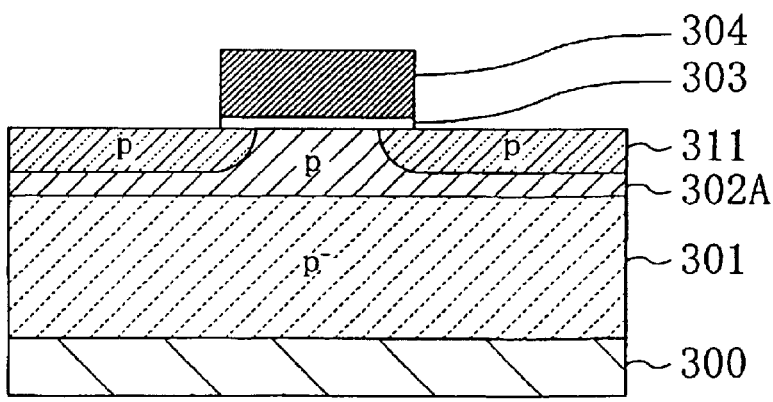

Next, a surface of the semiconductor substrate 300 is oxidized to form a first silicon oxide film having a thickness of 2 nm to 5 nm. Subsequently, a polysilicon film having a thickness of about 200 nm to 300 nm is deposited over the entire surface of the first silicon oxide film. Then, the polysilicon film and the first silicon oxide film are patterned to form the gate insulating film 303 and the gate electrode 304, as shown in FIG. 18(b).

Next, ions of an atom belonging to the Group IV, such as silicon ions, are implanted into the p-type impurity layer 302A with an implant energy of 5 keV to 10 keV and at $1 \times 10^-$cm$^{-2}$ to $5 \times 10^{14}$ cm$^{-2}$ by using the gate electrode 304 as a mask, thereby forming silicon implanted layers 311 in upper portions of the p-type impurity layer 302A.

Figure 19A:
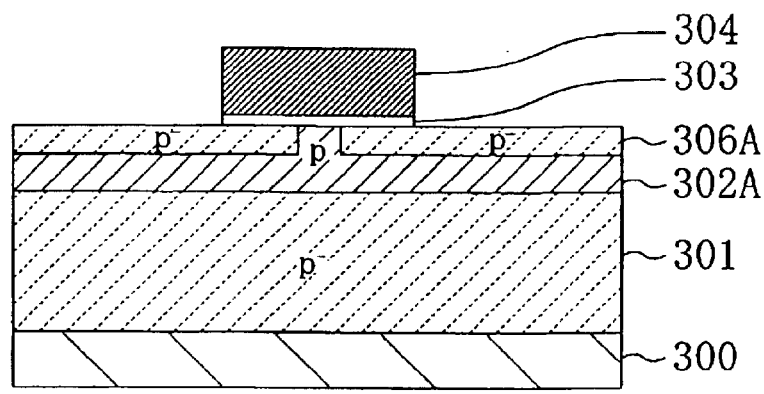
FIGS. 19(a) to (c) are cross-sectional views illustrating the individual process steps of the method of fabricating the semiconductor device according to the tenth embodiment of the present invention.

Next, a first heat treatment, which is a low-temperature long-time heat treatment, is performed with respect to the semiconductor substrate 300 at a temperature of about 600° C. to 850° C. for about 10 minutes to 200 minutes, whereby p-type lightly doped impurity layers 306A containing the activated impurity at a concentration lower than in the p-type impurity 302A are formed over upper portions of the silicon implanted layers 311 and an upper portion of the p-type impurity layer 302A, as shown in FIG. 19(a).

Figure 19B:
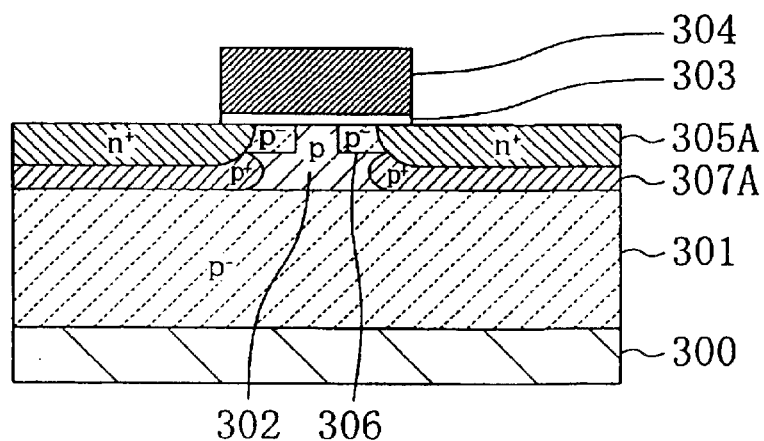

Next, as shown in FIG. 19(b), p$^+$-type impurity layers 307A are formed in lower portions of the p-type impurity layer 302A by implanting indium ions into the p-type impurity layer 302A with an implant energy of 50 to 200 keV and a dose of $1 \times 10^{13}$ cm$^{-2}$ to $1 \times 10^{14}$ cm$^{-2}$ by using the gate electrode 304 as a mask.

Next, n$^+$-type impurity layers 305A are formed in the p$^-$-type lightly doped impurity layers 306A and in upper portions of the p-type impurity layer 302A by implanting an n-type impurity such as arsenic ions into the p⁻-type lightly doped impurity layers 306A and into the p-type impurity layer 302A with an implant energy of 5 keV to 10 keV and a dose of $5\times10^{14}$ cm⁻² to $1\times10^{15}$ cm⁻² by using the gate electrode 304 as a mask. Thereafter, a second heat treatment, which is high-temperature short-time heat treatment, is performed with respect to the semiconductor substrate 300 at a temperature of, e.g., 1000° C. for 10 seconds.

Figure 19C:
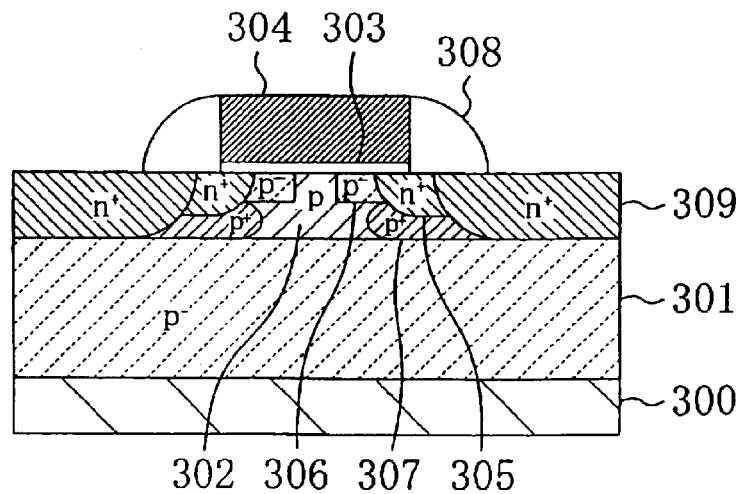
Figure 20:
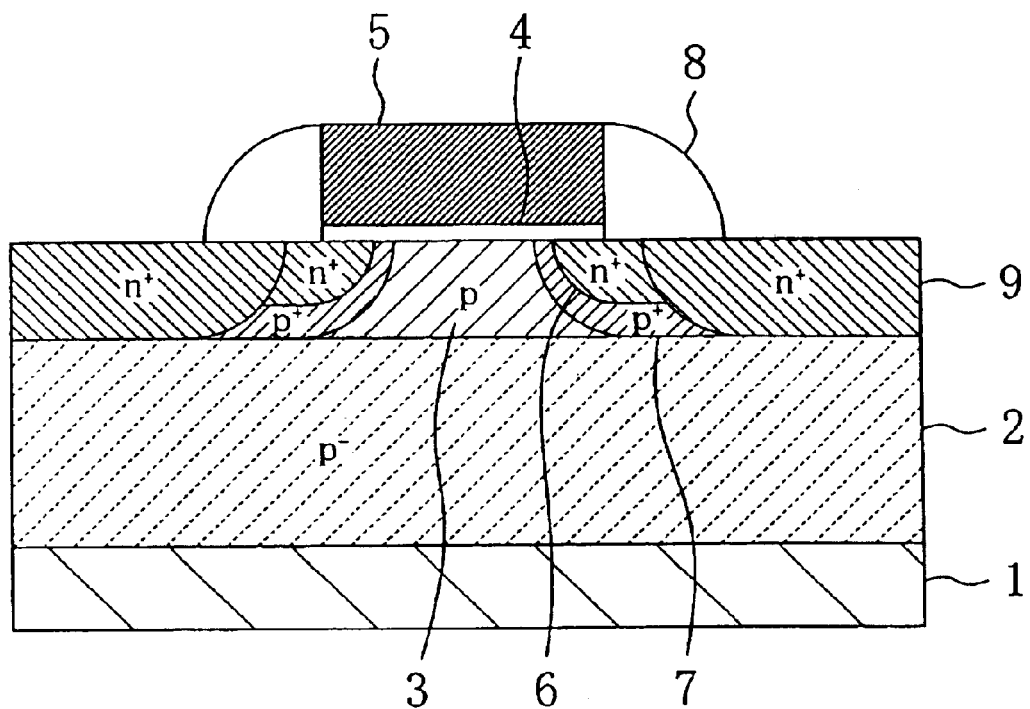
FIG. 20 is a cross-sectional view showing a conventional semiconductor device.

Next, a second silicon oxide film is deposited over the entire surface of the semiconductor substrate 300 and then subjected to anisotropic etching, thereby forming the sidewalls 308 on the side surfaces of the gate electrode 304, as shown in FIG. 19(c).

Next, an n-type impurity such as arsenic ions is ion implanted into the n⁺-type impurity layers 305A and the p⁺-type impurity layers 307A, which are then subjected to a heat treatment for activating the arsenic ions. Thereafter, a third heat treatment, which is a high-temperature short-time heat treatment, is performed at a temperature of 1000° C. for 10 seconds to eliminate the crystal point defects.

As a result, the source/drain regions 309 each composed of the n⁺-type activated impurity layer are formed in the regions of the n⁺-type impurity layers 105A and p⁺-type impurity layers 307A located on both sides of the gate electrode 304, the extension regions 305 composed of the n⁺-type impurity layers 305A are formed inwardly of the respective upper portions of the source/drain regions 309 in the n⁺-type impurity layers 305A, and the pocket regions 307 composed of the p⁺-type impurity layers 307A are formed inwardly of the respective lower portions of the source/drain regions 309 in the p⁺-type impurity layers 307A, as shown in FIG. 8(c).

Since the tenth embodiment comprises the steps of forming the p-type impurity layer 302A by implanting indium ions, forming the silicon implanted layers 311 by implanting silicon ions, and performing the low-temperature long-time first heat treatment with respect to the semiconductor substrate 300, the p⁻-type lightly doped impurity layers 306A containing the activated impurity at a concentration lower than in the p-type impurity 302A can be formed in the upper portions of the p-type impurity layer 302A. The mechanism of the formation of the p⁻-type lightly doped impurity layers 306A is the same as in the sixth embodiment.

Since the tenth embodiment has formed the p⁺-type impurity layers 307A as the pocket regions 307 by implanting indium ions having an atomic mass larger than that of boron ions and then performed the high-temperature short-time second heat treatment immediately thereafter, the expansion of the p⁺-type impurity layers 307A as the pocket regions 307 is prevented. This allows formation of the p⁺-type impurity layers 307A as the pocket regions 307 in spaced relation to the gate insulating film 303.

Since the tenth embodiment has formed the p⁺-type impurity layers 307A as the pocket regions 307 by implanting indium ions and then formed the n⁺-type impurity layers 305A as the extension regions 305 by implanting arsenic ions, the phenomenon of channeling of arsenic ions in the n⁺-type impurity layers 305A is suppressed. As a result, the distribution of impurity concentration in the extension regions 305 composed of the n⁺-type impurity layers 305A becomes sharp, which reduces the parasitic resistance of the extension regions 305 and suppresses a short-channel effect.

Moreover, since the tenth embodiment has formed the p-type impurity layer 302A as the channel region 302 by implanting indium ions, a so-called retrograde channel is formed, similarly to the sixth embodiment. As a result, the lowering of the mobility of carriers in the channel region 302 is prevented.

What is claimed is:

1. A semiconductor device comprising:
   a gate electrode formed on a semiconductor substrate with a gate insulating film interposed therebetween;
   a channel region composed of a first-conductivity-type impurity layer formed in a region of a surface portion of the semiconductor substrate located below the gate electrode;
   source/drain regions composed of second-conductivity-type impurity layers formed in regions of the surface portion of the semiconductor substrate located on both sides of the gate electrode;
   second-conductivity-type extension regions formed between the channel region and respective upper portions of the source/drain regions in contact relation with the source/drain regions; and
   first-conductivity-type pocket regions doped with indium ions, and formed between the channel region and respective lower portions of the source/drain regions, such that the first-conductivity-type pocket regions are in contact with the source/drain regions and in no contact with the gate insulating film.

2. The semiconductor device of claim 1, wherein a dose of the indium ions in the pocket regions is $5\times10^{13}$ cm⁻² or less.

3. The semiconductor device of claim 1, wherein a dose of the indium ions in the pocket regions is between $1\times10^{13}$ cm- and $5\times10^{13}$ cm⁻².

4. The semiconductor device of claim 1, wherein a dose of the impurity ions in the channel region is between $4\times10^{12}$ cm⁻² and $1\times10^{13}$ cm⁻².

5. The semiconductor device of claim 1, further comprising a first-conductivity-type well region formed in the semiconductor substrate,
   wherein the channel region is formed in the surface region of the semiconductor substrate and over the well region, and has an impurity ions concentration higher than the impurity ions concentration of the well region.

6. The semiconductor device of claim 1, wherein the channel region is composed of boron ions or indium ions.

7. A semiconductor device comprising:
   a gate electrode formed on a semiconductor substrate with a gate insulating film interposed therebetween;
   a channel region composed of a first-conductivity-type impurity layer formed in a region of a surface portion of the semiconductor substrate located below the gate electrode;
   source/drain regions composed of second-conductivity-type impurity layers formed in regions of the surface portion of the semiconductor substrate located on both sides of the gate electrode;
   second-conductivity-type extension regions formed between the channel region and respective upper portions of the source/drain regions in contact with the source/drain regions;
   first-conductivity-type pocket regions formed between the channel region and respective lower portions of the source/drain regions in contact with the source/drain regions and spaced apart from the gate insulating film; and
   first-conductivity-type lightly doped channel regions formed in both side portions of the channel region in contact with the extension regions, each of the lightly doped channel regions containing an activated impurity at a concentration lower than in a center portion of the channel region.

8. The semiconductor device of claim 7, wherein the channel region contains indium ions.

9. A semiconductor device comprising:

a gate electrode formed on a semiconductor substrate with a gate insulating film interposed therebetween;

a channel region composed of a first-conductivity-type impurity layer doped with indium ions and formed in a region of a surface portion of the semiconductor substrate located below the gate electrode;

source/drain regions composed of second-conductivity-type impurity layers formed in regions of the surface portion of the semiconductor substrate located on both sides of the gate electrode;

second-conductivity-type extension regions formed between the channel region and respective upper portions of the source/drain regions in contact with the source/drain regions; and first-conductivity-type lightly doped channel regions formed in both side portions of the channel region in contact with the extension regions, each of the lightly doped channel regions containing an activated impurity at a concentration lower than in a center portion of the channel region.

* * * * *